US 6,635,114 B2

United States Patent
Zhao et al.

(10) Patent No.: US 6,635,114 B2
(45) Date of Patent: *Oct. 21, 2003

(54) HIGH TEMPERATURE FILTER FOR CVD APPARATUS

(75) Inventors: Jun Zhao, Cupertino, CA (US); Charles Dornfest, Fremont, CA (US); Frank Chang, San Jose, CA (US); Xiaoliang Jin, San Jose, CA (US); Po Tang, San Jose, CA (US)

(73) Assignee: Applied Material, Inc., Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 96 days.

(21) Appl. No.: 09/467,296

(22) Filed: Dec. 17, 1999

(65) Prior Publication Data
US 2003/0033978 A1 Feb. 20, 2003

(51) Int. Cl.$^7$ ............................................. C23C 16/00
(52) U.S. Cl. ................ 118/715; 118/726; 156/345.29
(58) Field of Search ................ 118/715, 726; 156/345.29

(56) References Cited

U.S. PATENT DOCUMENTS

| | | | |
|---|---|---|---|
| 3,805,425 A | 4/1974 | Spoida et al. | 38/69 |
| 4,616,122 A | 10/1986 | Burian, deceased et al. | 219/273 |
| 4,947,789 A | 8/1990 | Hussla et al. | 118/715 |
| 4,977,855 A | 12/1990 | Ohmi et al. | 118/722 |
| 4,986,216 A * | 1/1991 | Ohmori et al. | 118/715 |
| 5,000,113 A | 3/1991 | Wang et al. | 118/723 |

(List continued on next page.)

FOREIGN PATENT DOCUMENTS

| | | |
|---|---|---|
| EP | 0 636 704 A1 | 2/1995 |
| EP | 0738788 A2 | 10/1996 |

(List continued on next page.)

OTHER PUBLICATIONS

U.S. patent application Ser. No. 08/749,613, Fairbairn, filed Nov. 18, 1996.

(List continued on next page.)

*Primary Examiner*—Jeffrie R. Lund
(74) *Attorney, Agent, or Firm*—Moser, Patterson & Sheridan, LLP

(57) ABSTRACT

The present invention generally provides a deposition chamber for depositing materials which require vaporization, especially low volatility precursors, which are transported as a liquid to a vaporizer to be converted to vapor phase through one or more vaporizing elements and which must be transported at elevated temperatures to prevent unwanted condensation on chamber components. In one aspect, the chamber comprises a series of heated temperature controlled internal liners as vaporizing surfaces which are configured for rapid removal, cleaning and/or replacement and preferably are made of a material having a thermal coefficient of expansion close to that of the deposition material. The vaporizing surfaces "flash" sprayed liquid precursors on the surface of the vaporizing surfaces and then purify the flashed precursors before flowing further into the system. Particularly contemplated is an apparatus and process for the deposition of a metal-oxide film, such as a barium, strontium, titanium oxide (BST) film, on a silicon wafer to make integrated circuit capacitors useful in high capacity dynamic memory modules. Preferably, internal surfaces of the chamber are adjustable and maintainable at a suitable temperature above ambient, e.g., about 150° C. to about 300° C., to prevent decomposition and/or condensation of vaporized material on the chamber and related gas flow surfaces.

28 Claims, 19 Drawing Sheets

U.S. PATENT DOCUMENTS

| | | | | |
|---|---|---|---|---|
| 5,112,442 | A | | 5/1992 | Goodson ..................... 159/49 |
| 5,204,341 | A | | 4/1993 | Toja et al. ..................... 505/1 |
| 5,224,202 | A | | 6/1993 | Arnold et al. ............... 392/399 |
| 5,360,572 | A | * | 11/1994 | Hotaling et al. ............ 210/188 |
| 5,372,754 | A | | 12/1994 | Ono ........................... 261/142 |
| 5,383,970 | A | | 1/1995 | Asaba et al. ................ 118/726 |
| 5,421,895 | A | | 6/1995 | Tsubouchi et al. .......... 118/726 |
| 5,835,678 | A | | 11/1998 | Li et al. ...................... 392/401 |
| 5,849,089 | A | | 12/1998 | Tsunashima et al. ........ 118/726 |
| 5,879,458 | A | * | 3/1999 | Roberson et al. ........... 118/715 |
| 5,882,416 | A | | 3/1999 | Van Buskirk et al. ...... 118/726 |
| 5,961,678 | A | * | 10/1999 | Pruette et al. ............... 210/448 |
| 6,056,823 | A | * | 5/2000 | Sajoto et al. ................ 118/715 |
| 6,077,157 | A | * | 6/2000 | Fairbairn et al. ............. 454/49 |
| 6,139,642 | A | * | 10/2000 | Shimahara et al. .......... 118/715 |
| 6,210,458 | B1 | * | 4/2001 | Shindo et al. ............... 264/632 |
| 6,210,485 | B1 | * | 4/2001 | Zhao et al. .................. 118/715 |
| 6,409,839 | B1 | * | 6/2002 | Sun et al. .................... 118/726 |

FOREIGN PATENT DOCUMENTS

| | | | | |
|---|---|---|---|---|
| EP | 0780490 A1 | 6/1997 | | |
| FR | 2 692 597 A1 | 12/1993 | ........... | C23C/16/00 |
| JP | 59-188553 | 10/1984 | .......... | G01N/31/00 |
| JP | 02-007519 | 1/1990 | ......... | H01L/21/302 |
| JP | 04-089378 | 3/1992 | ............ | C04B/41/87 |
| JP | 07-195086 | 8/1995 | ............. | C02F/1/68 |
| WO | 99/13545 | 3/1999 | ............ | H02G/3/00 |

OTHER PUBLICATIONS

U.S. patent application Ser. No. 08/927,700, Somekh, et al., filed Sep. 11, 1997.

U.S. patent application Ser. No. 09/052,743, Sajoto, et al., filed Mar. 31, 1998.

U.S. patent application Ser. No. 09/052,747, Sajoto, et al., filed Mar. 31, 1998.

U.S. patent application Ser. No. 09/052,763, Zhao, et al., filed Mar. 31, 1998.

U.S. patent application Ser. No. 09/052,765, Zhao, et al., filed Mar. 31, 1998.

U.S. patent application Ser. No. 09/052,766, Sajoto, et al., filed Mar. 31, 1998.

U.S. patent application Ser. No. 09/052,792, Sajoto, et al., filed Mar. 31, 1998.

U.S. patent application Ser. No. 09/052,885, Sajoto, et al., filed Mar. 31, 1998.

PCT Parent Application No. PCT/US98/18457 Search Report dated Jan. 27, 1999.

EPO Search Report, for EP No. 00311341.2, dated Apr. 3, 2001.

* cited by examiner

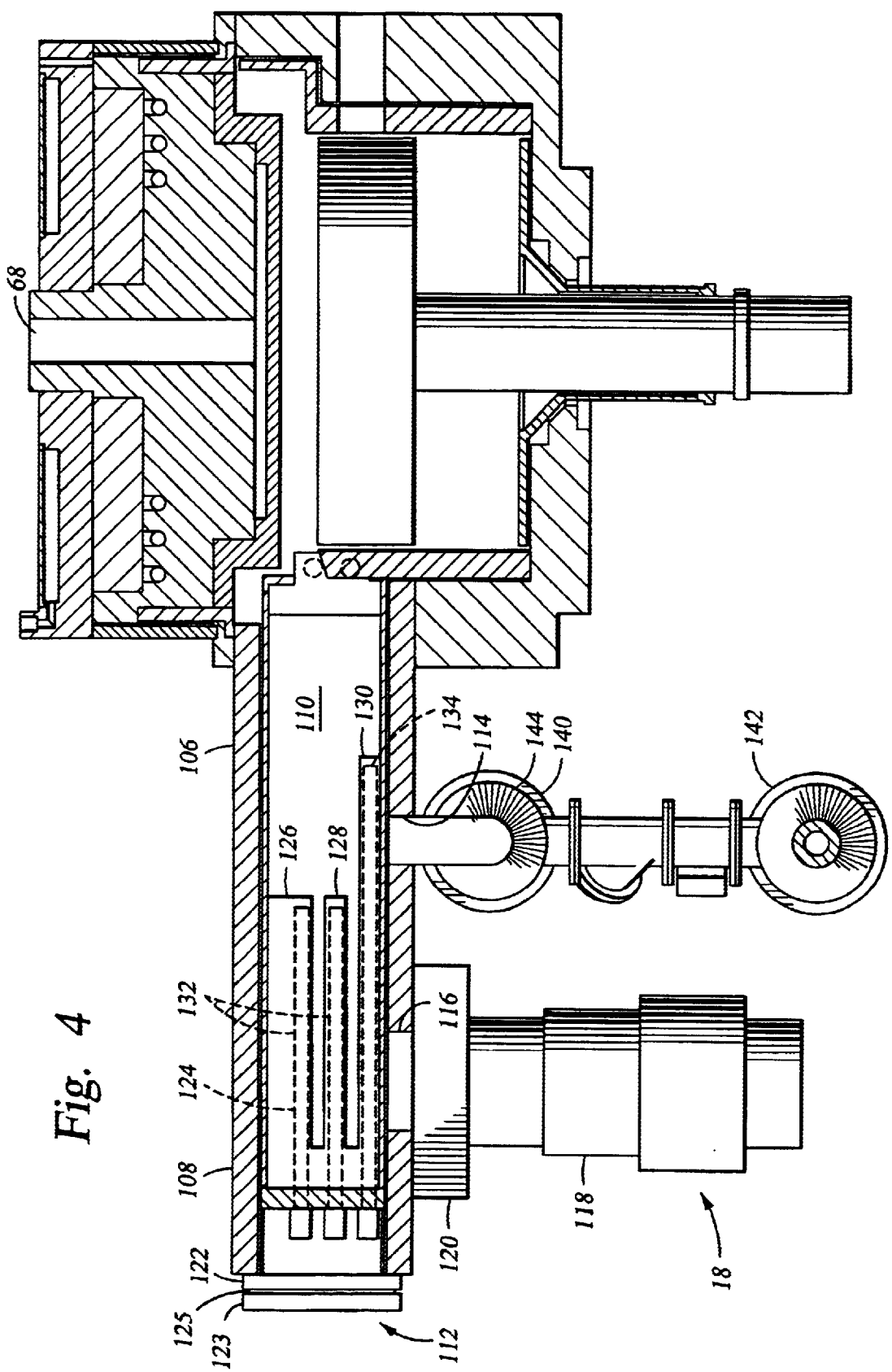

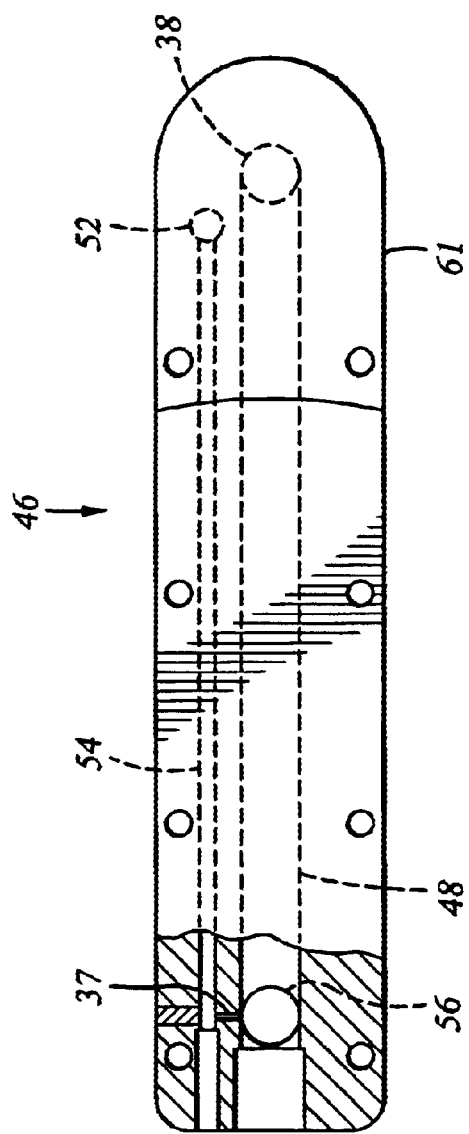
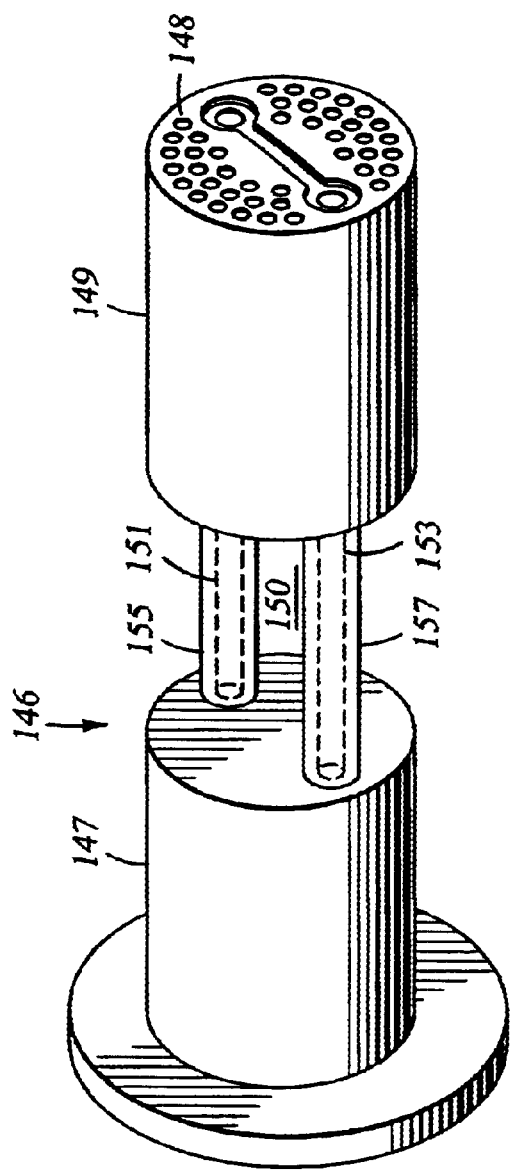
Fig. 8
Fig. 13

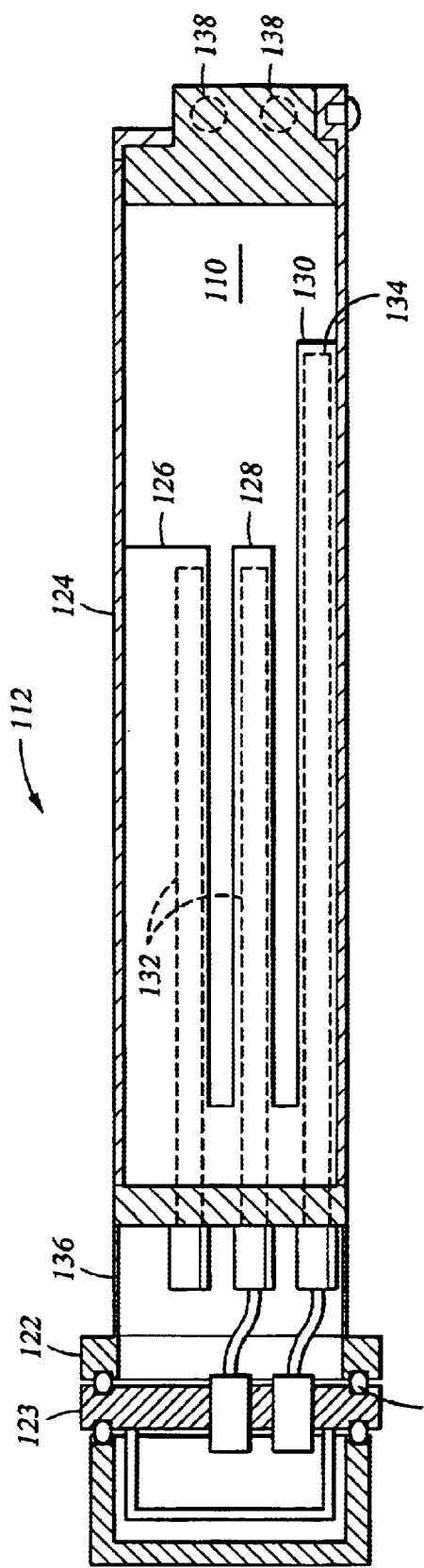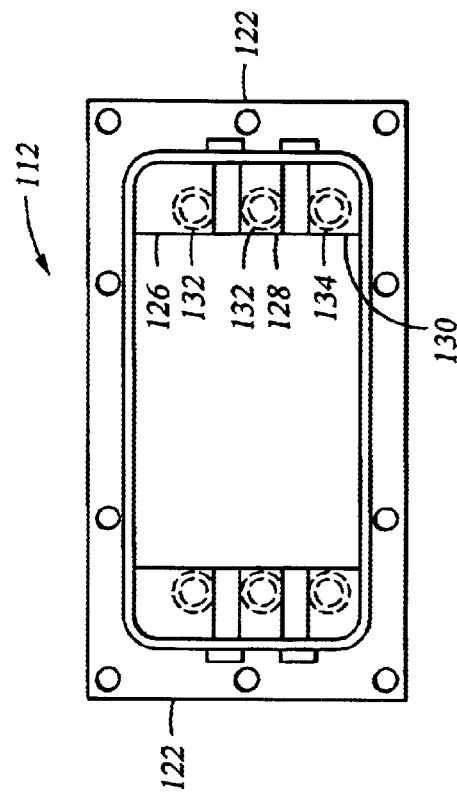
Fig. 11
Fig. 12

HIGH TEMPERATURE FILTER FOR CVD APPARATUS

BACKGROUND OF THE INVENTION

1. Field of the Invention

The invention relates to an apparatus and process for the vaporization and filtration of liquid precursors and deposition of a film on a suitable substrate. More specifically, the invention relates to an apparatus and process for filtering precursors related to the deposition of a metal-oxide film, such as a barium strontium titanate (BST) film, on a substrate.

2. Background of the Invention

The increasing density of integrated circuits (ICs) is increasing the need for materials with high dielectric constants to be used in electrical devices such as capacitors for forming high capacity DRAMs. Capacitors containing high-dielectric-constant materials, such as organometallic compounds, usually have much larger capacitance densities than standard $SiO_2$—$Si_3N_4$—$SiO_2$ stack capacitors. Thus, the organometallic compounds are presently the materials of choice in IC fabrication.

One organometallic compound of increasing interest as a material for use in ultra large scale integrated (ULSI) DRAMs is BST due to its high capacitance. Deposition techniques used in the past to deposit BST include RF magnetron sputtering, laser ablation, sol-gel processing, and chemical vapor deposition (CVD) of metal organic materials.

A liquid source BST CVD process entails atomizing a compound, vaporizing the atomized compound, depositing the vaporized compound on a heated substrate and annealing the deposited film. The process requires a high level of control over the liquid precursors and gases from the introduction of the precursor from an ampoule into a delivery system which includes vaporization and ultimate delivery of the compound to the surface of the substrate where the compound is deposited.

A goal is to achieve a repeatable process which deposits a film of uniform thickness under the effects of a controlled temperature and pressure environment. However, this goal has not been satisfactorily achieved, because the BST precursors have a narrow range for vaporization between decomposition at higher temperatures and condensation at lower temperatures. Thus, the temperature controlled flow paths from the vaporizer into the chamber and through the exhaust system must be controlled relatively tightly. In addition, the precursors tend to form deposits in the delivery lines and valves disposed throughout the system.

Another difficulty encountered is the difficulty or lack of efficiency in vaporizing the liquid precursors. Typically, only a portion of the liquid precursors are vaporized due to low conductance in the vaporizer, thereby inhibiting deposition rates and resulting in processes which are not consistently repeatable. In addition, known vaporizers used in CVD processes incorporate narrow passages which eventually become clogged with unvaporized precursor during use and are not adapted for continuous flow processes which can be stabilized. The clogged passages result in a reduction in vaporization efficiency of the liquid precursors which negatively affects process repeatability and deposition rate. Still further, known vaporizers lack temperature controlled surfaces and the ability to maintain liquid precursors at a temperature low enough to prevent decomposition of the precursor prior to injection into the vaporizer. Thus, the lack of appropriate temperature control results in deposition of material in the injection lines in the vaporizer and premature condensation or unwanted decomposition of the precursors.

Therefore, there is a need for a deposition apparatus and method which can deliver liquid precursors to a vaporizer, efficiently vaporize and filter the precursors contemporaneously, deliver the vaporized precursors to the surface of a substrate and exhaust the system while maintaining elevated temperatures in the chamber, preventing unwanted condensation or decomposition of precursors along the pathway and avoiding temperature gradients in the system.

SUMMARY OF THE INVENTION

The present invention generally provides a deposition chamber for depositing materials which require vaporization, especially low volatility precursors, which are transported as a liquid to a vaporizer to be converted to vapor phase through one or more vaporizing elements and which must be transported at elevated temperatures to prevent unwanted condensation on chamber components. In one aspect, the chamber comprises a series of heated temperature controlled internal liners as vaporizing surfaces which are configured for rapid removal, cleaning and/or replacement and preferably are made of a material having a thermal coefficient of expansion close to that of the deposition material. The vaporizing surfaces "flash" sprayed liquid precursors on the surface of the vaporizing surfaces and then purify the flashed precursors before flowing further into the system. Particularly contemplated is an apparatus and process for the deposition of a metal-oxide film, such as a barium, strontium, titanium oxide (BST) film, on a silicon wafer to make integrated circuit capacitors useful in high capacity dynamic memory modules. Preferably, internal surfaces of the chamber are adjustable and maintainable at a suitable temperature above ambient, e.g., about 150° C. to about 300° C., to prevent decomposition and/or condensation of vaporized material on the chamber and related gas flow surfaces.

In one aspect, a gas feedthrough for a processing chamber comprises a conduit having an inlet and an outlet, the conduit defining a surface for forming a seal with the chamber, and a filter disposed in the conduit, said filter having a pore size and a surface area sufficient to prevent an excessive pressure differential to form across said filter.

In another aspect, a method of depositing a film comprises delivering one or more liquid precursors to a vaporizer, vaporizing the one or more liquid precursors, flowing the vaporized precursors through a gas feedthrough, and filtering the vaporized precursors in the gas feedthrough.

In another aspect, a vaporizer for a substrate processing system comprises an entry site for a liquid precursor, a perforated distributor surface sealably disposed around said precursor entry site for vaporizing said liquid precursor, an exit site for vaporized precursor, at least one filter disposed between said perforated distributor surface and said exit site, and a heating member thermally coupled to an interior of said vaporizer. In another aspect, a vaporizer for a substrate processing system comprises a body, a nozzle disposed in the body, and one or more vaporizing members disposed around said nozzle, having a porosity through which vaporized fluids pass of about 100 μm or less.

In another aspect, a process chamber for depositing a film comprises a chamber body forming an enclosure having one or more temperature controlled surfaces, a lid movably mounted on the chamber body, said lid having a heated main body and an outer temperature-controlled collar and an annular gas feedthrough fluidically coupled to said chamber and to a gas source, the feedthrough having a filter disposed therein, said filter having a pore size and a surface area sufficient to prevent an excessive pressure differential to form across said filter. In another aspect, a process chamber for depositing a film comprises a chamber body having one or more temperature controlled surfaces, a lid movably mounted on the chamber body, and a vaporizer. The vaporizer comprises an entry site for a liquid precursor, a perforated distributor surface disposed around said precursor entry site for vaporizing said liquid precursor, an exit site for vaporized precursor, at least one filter disposed between said perforated distributor surface and said exit site, and a heating member thermally coupled to an interior of said vaporizer.

In another aspect, a process chamber for depositing a film comprises a chamber body having one or more temperature controlled surfaces, a lid movably mounted on the chamber body, said lid having a heated main body and a temperature controlled collar, and a gas feedthrough fluidically coupled to said chamber and to a gas source, said feedthrough having a filter disposed therein. In another aspect, a gas feedthrough for a processing chamber comprises a conduit having an inlet and an outlet, the conduit defining a surface for forming a seal with the chamber, and a filter disposed in the conduit. In another aspect, a process chamber for depositing a film comprises a chamber body having one or more temperature controlled surfaces, a lid movably mounted on the chamber body, the lid having a heated main body and a temperature controlled collar, and a vaporizer fluidically coupled to the chamber body, the vaporizer comprising a nozzle disposed in the vaporizer and one or more vaporizing members disposed around the nozzle, the vaporizing members having a pore size of about 100 µm or less.

BRIEF DESCRIPTION OF THE FIGURES

FIG. 4 cross sectional view of an alternative embodiment of a chamber and associated purge gas pumping nose assembly of the present invention;

FIG. 8 is a partial cross sectional view of a gas manifold;

FIG. 11 is a side view of a heated nose liner;

FIG. 12 is an end view of a mounting flange for the nose liner;

FIG. 13 is a perspective view of a cold trap filter member;

DETAILED DESCRIPTION OF THE INVENTION

The present invention is directed to a liquid delivery chemical vapor deposition (CVD) system useful in depositing thin metal-oxide films as well as other films requiring vaporization of precursor liquids. The system has particular application for the fabrication of metal-oxide dielectrics useful in making capacitors used in ULSI DRAMs as well as a number of other electrical devices. In general, devices that can be made with the present system are those characterized by having one or more layers of insulating, dielectric or electrode material deposited on a substrate.

Figure 1:
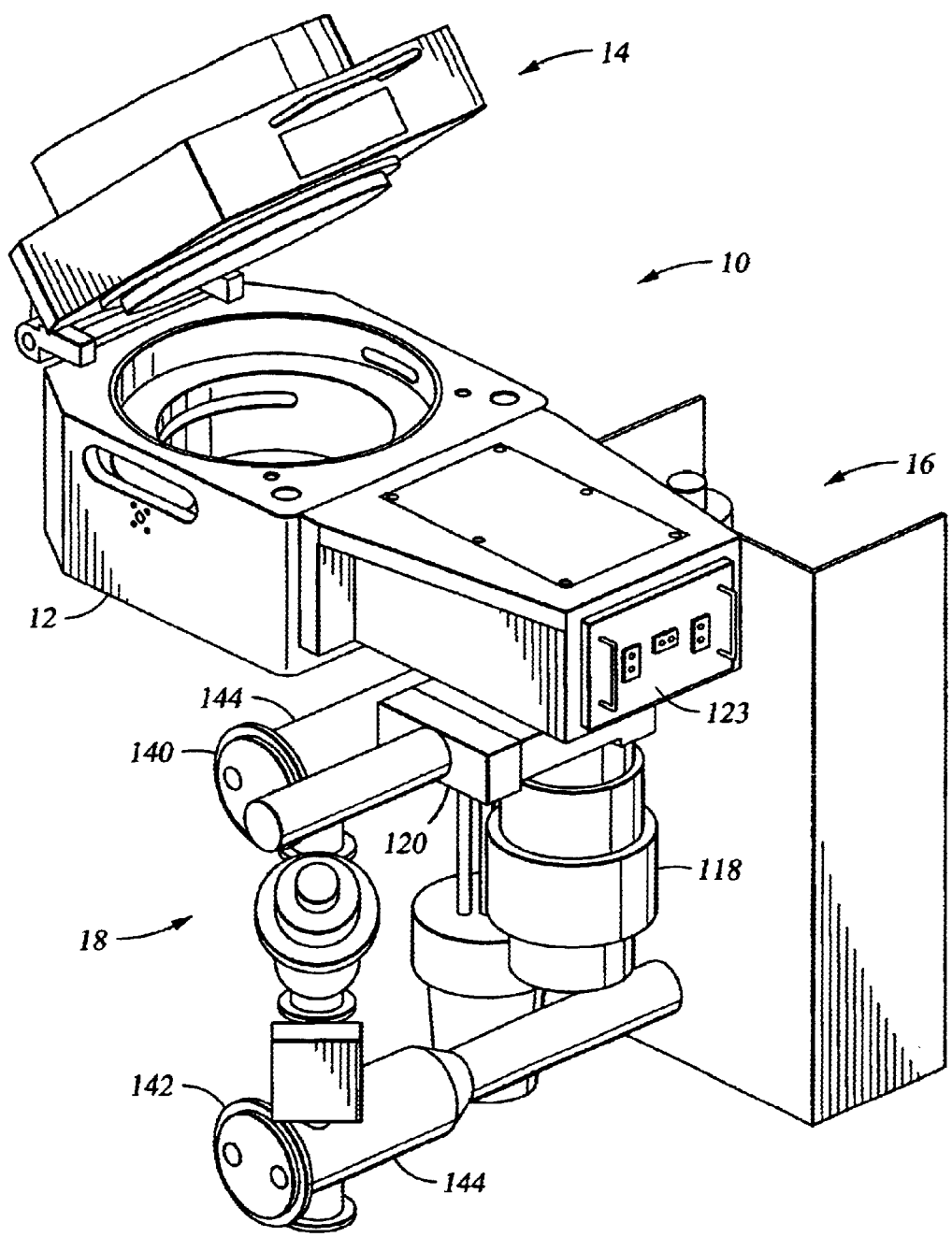
FIG. 1 is a perspective view of a chamber system of the present invention.

FIG. 1 is a perspective view of a CVD system 10 of the present invention. The system 10 generally includes a chamber body 12, a heated lid assembly 14, an integrated vaporizer module 16 and an exhaust/pumping system 18. Not shown in this figure, but a feature of the invention, is a liquid delivery system for supplying the liquid precursors to the vaporizer module. The size and dimensions of the system are dictated by the size and shape of the workpiece on which processes of the present invention are performed. A preferred embodiment of the invention will be described herein with reference to a chamber adapted to process a circular substrate, such as a 200 mm silicon wafer.

The inventors have recognized that deposition layer uniformity can be enhanced, and system maintenance can be reduced, if substantially all of the system components (other than the substrate and substrate heater) which "see" the process chemistry are substantially maintained at an ideal isothermal system temperature (e.g., 270° C.±5° for BST). The deposition chamber incorporates several active and passive thermal control systems, including features for minimizing temperature gradients that can be created as a result of the relatively high temperature of the substrate and the substrate support member. The deposition chamber also includes thermal control features which serve to protect a main chamber seal by cooling it below the ideal isothermal system temperature. Other similar thermal control features maintain at a relatively safe temperature a cover enclosing the chamber lid to prevent burn injuries. Cooling is achieved without inducing significant temperature fluctuations and gradients in the system components exposed to the system chemistry, and without excessive cooling and heating power losses.

The Deposition Chamber

Figure 2:
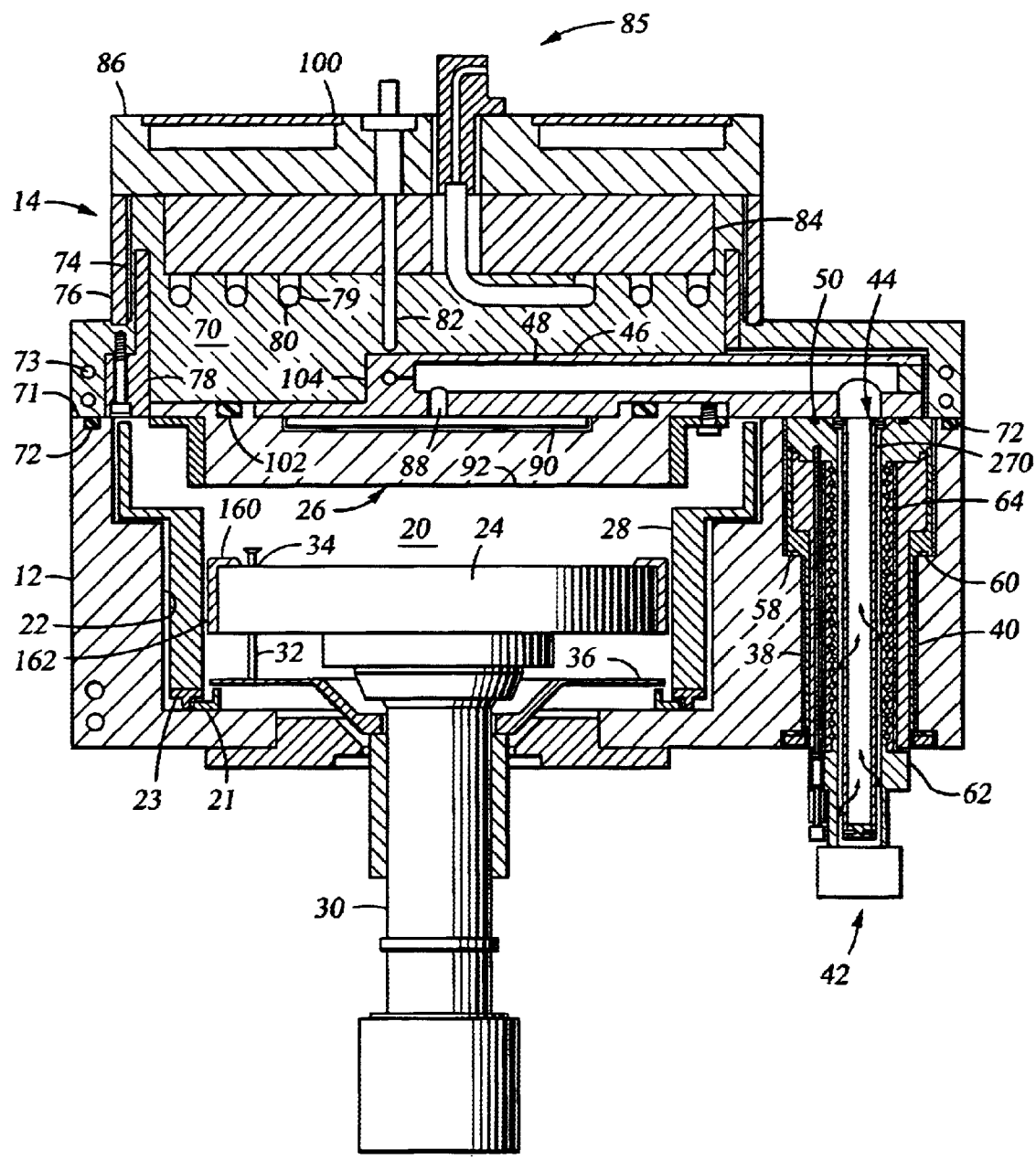
FIG. 2 is cross sectional view of a chamber of the present invention.

FIG. 2 is a cross sectional view of one embodiment of a deposition chamber showing the chamber body 12 supporting a heated lid assembly 14. The chamber body 12 defines an inner annular processing region 20 defined on the perimeter by an inner wall 22. A substrate support member 24 extends through the bottom of the chamber and defines the lower end of the processing region 20. A gas distribution plate 26 mounted on the lid forms the upper limit of the processing region 20. The chamber body 12 and the lid assembly 14 are preferably made of a rigid material such as aluminum, stainless steel or combinations thereof. The chamber body 12 also defines a pumping port for purging the remains of the deposition vapor once it has been delivered over the substrate. A generally U-shaped passage surrounding the gas distribution assembly forms a pumping channel through which gases are drawn into the exhaust system.

The substrate support member 24 may comprise a metal, e.g., aluminum, with a resistive heating element attached thereto or embedded therein. Alternatively, the support member may comprise a ceramic block and embedded ground plate which generates heat when subjected to RF energy emitted by an adjacent electrode. A suitable substrate support member and related lift assembly is shown and described in co-pending U.S. patent application Ser. No. 08/892,612 entitled "Improved Self Aligning Lift Mechanism," filed on Jul. 14, 1997, and is incorporated herein by reference. This substrate support member is available from Applied Materials, Inc. of Santa Clara, Calif. under the model name CxZ Heater.

The substrate support member generally is movable up and down on a central elevator shaft 30 to move a substrate between a deposition position adjacent the gas distribution plate 26 and a substrate insertion/removal position below a slit valve formed through the chamber body. The entry point of the shaft into the chamber is sealed with a collapsible bellows (not shown). The substrate is lifted from or placed on a robot blade by a set of lifting pins 32 slidably retained in a set of four passageways 34 extending through the substrate support member 24. Directly below each of the pins is a lifting plate 36 which moves the pins vertically within the chamber to allow a substrate to be lifted off or placed on a robot blade which is moved into the chamber through the slit valve opening (not shown).

The chamber body 12 defines one or more passages 38 for receiving a heated gas delivery feedthrough 40 having an inlet 42 and an outlet 44 to deliver one or more precursor gases into the gas distribution plate 26 mounted on the lid assembly 14. The passage 38 defines an upper and a lower end of differing diameters to form a shoulder 58 where the upper and lower ends meet. The gas outlet 44 is fluidically connected to a mixing gas manifold 46 which includes at least a first gas passage 48 to deliver a gas(es) into the gas distribution plate 26. A seal 50, preferably made of TEFLON® with a stainless steel c-spring, is located around the outlet 44 on the upper chamber wall to provide a sealing connection between the gas delivery feedthrough 40 and the gas manifold 46.

Figure 3A:
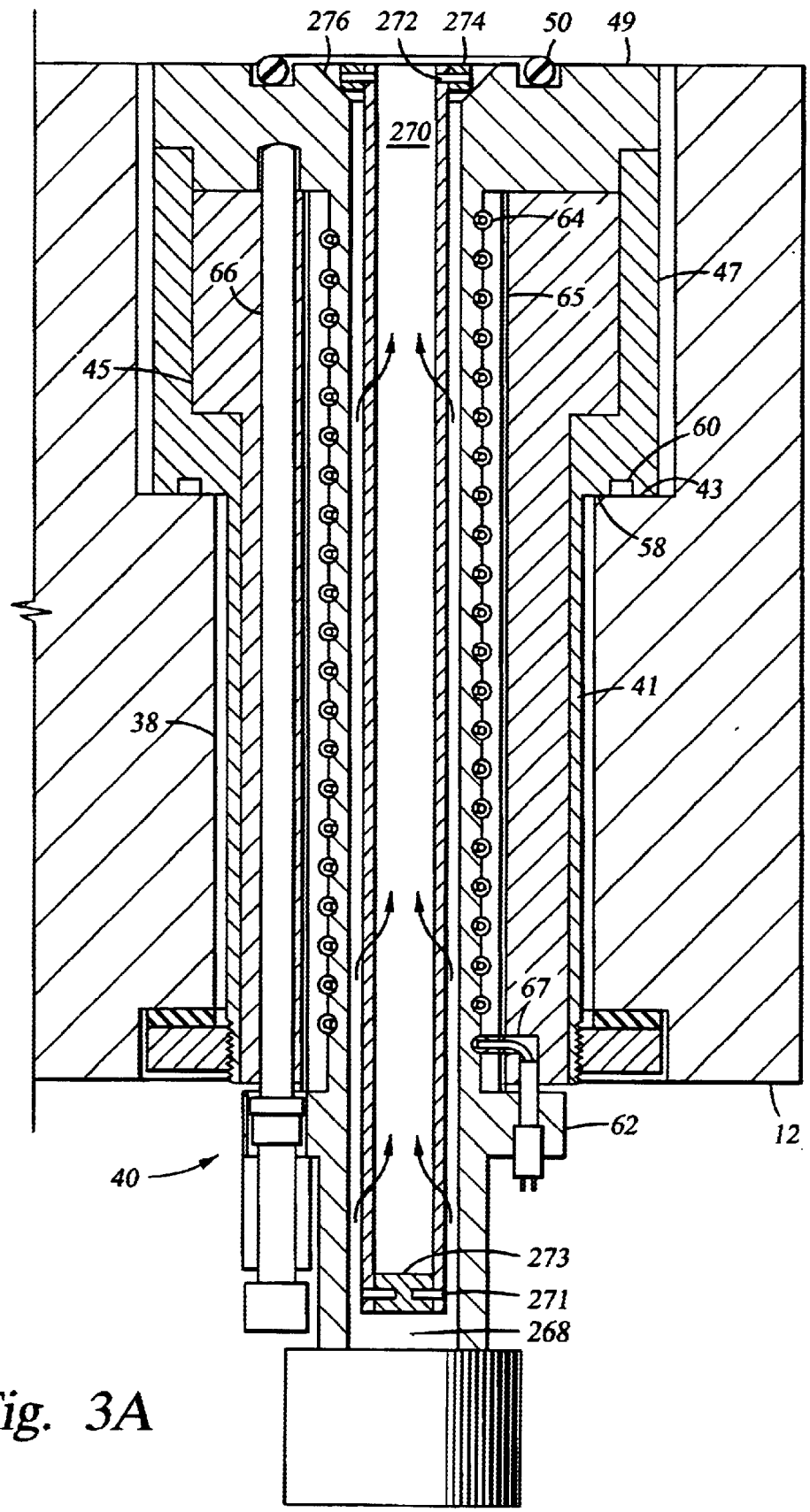
FIG. 3a is a cross sectional view of a heated gas feedthrough.

FIG. 3a is a cross sectional view showing a heated gas delivery feedthrough 40 disposed in the annular passage 38 formed through the chamber wall. The passage includes a shoulder 58 disposed on the upper end of the passage and includes a seal 50, such as an O-ring seal. The feedthrough preferably includes an outer conduit 41 and an inner conduit 45 disposed within the outer conduit. The outer conduit includes a mounting shoulder 43 which is mounted on shoulder 58 of the passage. The outer conduit also includes a lower end having threads thereon for receiving a lock nut to secure the feedthrough in a sealing position within the passage 38 against the shoulder 58 and seal 50. The inner conduit 45 defines an upper mounting surface 49 for forming a seal with the lid assembly at seal 50 and also includes a flange 62 on its lower end for mating with the bottom of the chamber body. A cable type heater 64, or other suitable heater, is disposed in intimate contact with the inner conduit of the feedthrough to heat the feedthrough to a desired temperature. A radiation shield 65 is disposed over the heater to prevent thermal radiation from heating the outer conduit 41. A power lead 67 extends from the lower end of the feedthrough and is connected to a suitable power source to heat the feedthrough. A thermocouple 66 is inserted or otherwise disposed in the heated gas delivery feedthrough 40 to monitor the temperature thereof. The feedthrough is mounted in the passage and secured therein using a screw type connector or other suitable connector.

The upper wall 47 of the outer conduit 41 is thinned and sized to define a gap between its outer surface and the inner wall of the chamber body to provide a heat choke adjacent the seal 50. Seal 50 is preferably a hot O-ring which can withstand temperatures of about 300° C. The thin wall minimizes heat conduction down to the shoulder 58 to protect seal 50. By minimizing heat conduction, less power is required to heat the feedthrough. Additionally, less thermal mass provides better thermal control and faster response for the feedback control. Still further, the heat choke on the outer conduit prevents heat loss from the mixing gas manifold 46 which is directly connected to the insert and which is heated by the lid body. This avoids generation of cold spots along the path of the vaporized gas.

A filter 270 can be disposed in a passageway 268 formed in the feedthrough 40 between the inlet 42 and the outlet 44. The filter 270 preferably comprises a cylindrical hollow member, such as a tube, having a porosity sized to purify the precursor gas flow through the feedthrough prior to the gases entering the gas manifold 46. Additionally, the porosity reduces the entry of non-vaporized liquid precursor materials. The filter material can be stainless steel or other materials that are non-reactive with the precursor gases, such as titanium, nickel, Hastalloy®, aluminum, aluminum oxide, barium strontium titanate, aluminum nitride, silicon carbide or combinations thereof. A preferable porosity through the filter material can be 100 $\mu$m (microns) or less, preferably about 5 to about 20 $\mu$m and most preferably about 10 $\mu$m. The porosity can be varied depending on the precursor components, desired flow rate and pressure drop, useful life of the filter, and cleanliness of the system. It has been discovered that a relatively large size of pore in the filter, e.g. 10 $\mu$m, is capable of filtering relatively small particulates, such as residue from a vaporizer operation, down to about 0.2 $\mu$m with relatively high efficiency at high operating temperatures such as about 150° C. to about 300° C. with a relatively low pressure differential across the filter. Alternatively, the filter material can be a sintered material having circuitous through-passages formed in the filter material. Preferably, the filter 270 extends a maximum distance in the feedthrough to increase surface area and to resist clogging, resulting in an increased filter life. Surface texture, such as grooves generated for example by threads, or other surface structures can also provide additional surface area. Preferably, the filter 270 is placed and removed in the passageway 268 by hand without necessitating tools once access is gained to the filter. The pressure drop across the filter disposed in the passageway 268 can be about one Torr to about twenty Torr, and preferably about one Torr to about two Torr, for a flow of about 400 sccm to about 500 sccm with a 10 $\mu$m pore size in a tube filter 270 having a ⅛ inch wall thickness. Lower porosities, such as 5 $\mu$m, can be used to increase the filtration levels. A porosity of about 10 $\mu$m is a practical balance between useful life and adequate filtration for BST processing. The porosities can vary depending on the level of filtration desired, the precursor and other components, and location in the vaporizer and system.

The filter 270 includes a collar 274 disposed about the upper end of the filter and is secured to the filter 270 by one or more pins 272 extending through the collar and into the filter. The inner conduit 45, defining the upper mounting surface 49, includes a tapered countersink 276 sized to receive the collar 274 coupled to the filter 270. The collar 274 and the pins 272 are preferably made of a high temperature polymer, such as TEFLON®. The collar 274 and corresponding countersink 276 can be a thickness and depth, respectively, sufficient to cause compression of the collar 274 when the feedthrough 40 is mounted to the lid assembly 14, shown in FIG. 2, to seal the upper end of the filter. Alternatively, the inner conduit 45 can include one or more O-rings (not shown) to seal the filter in the feedthrough. The filter 270 is designed to remove impurities generated in the gas flow stream caused by members, such as valving and other upstream equipment.

Figure 3B:
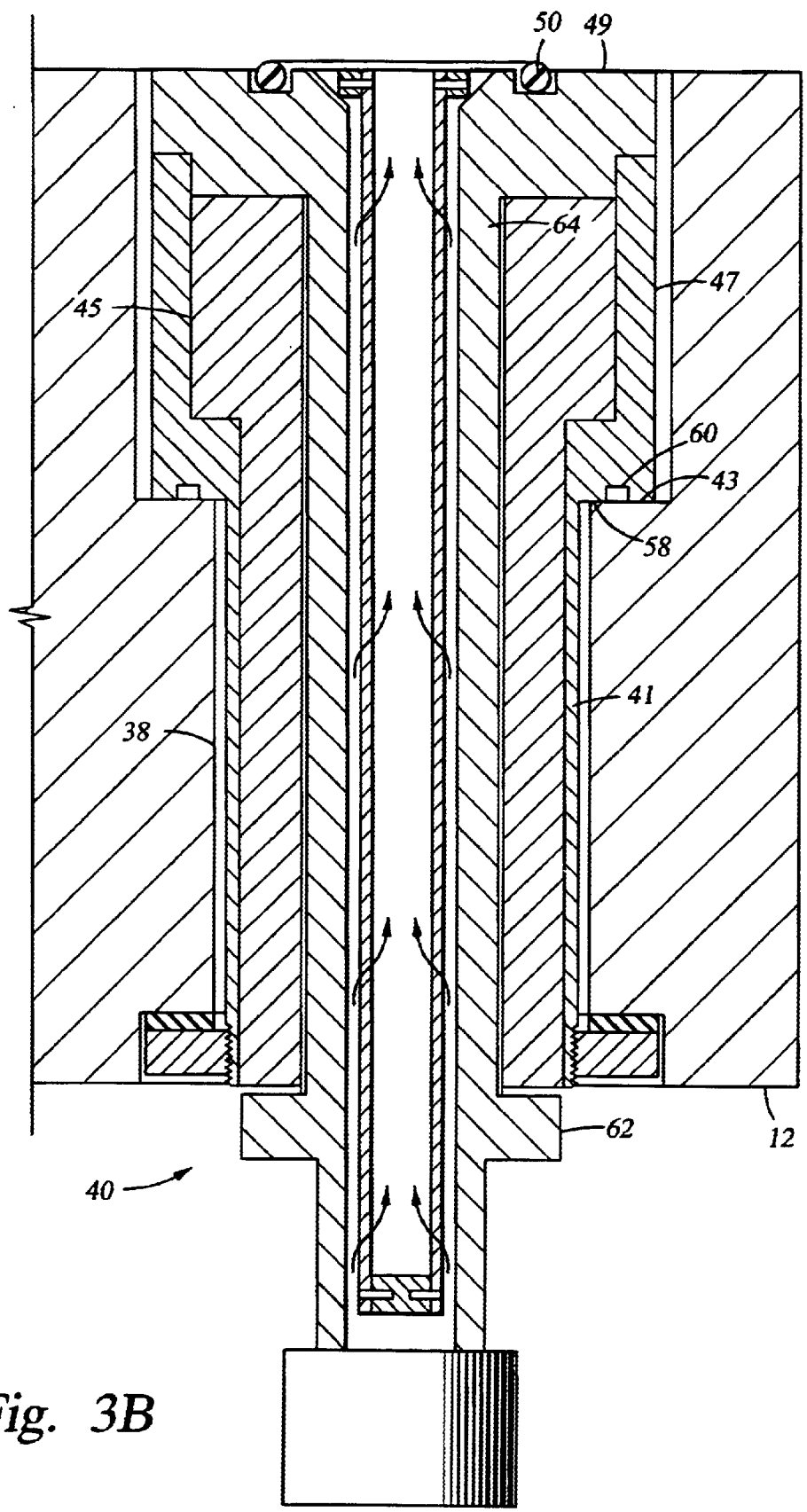
FIG. 3b is a cross sectional view of a gas feedthrough.

FIG. 3b illustrates an embodiment of a gas feedthrough which is not heated. The oxidizer gas(es) are flown through this non-heated feedthrough. However, in applications where a heated oxidizer gas feedthrough is required, one similar to that shown in FIG. 3a can be used. The feedthrough of FIG. 3b resembles that of FIG. 3a except that the cable heater and thermocouple are removed. In addition, the sizes of the feedthrough may vary depending on the requirements of the process. In one embodiment, the non-heated oxidizer gas feedthrough has a smaller gas passage and the overall dimensions are therefore somewhat smaller.

Referring again to FIG. 2, removable deposition chamber liners (which can be used at a number of different locations) facilitate periodic cleaning of the deposition chamber. A liner in accordance with a preferred embodiment of the invention includes an integral or functionally integral (i.e., assembled from one or more components as attached or overlapping units) generally chamber liner 28 that covers upper chamber surfaces adjacent the substrate support member 24 and a bottom liner 21 covers the lower chamber wall surfaces below substrate support member. The liner material may be made of a metal, e.g., stainless steel or aluminum, a ceramic material (e.g., $Al_2O_3$) or quartz, and can be equipped with an active PID controlled heating element which maintains the liner walls substantially at the optimum isothermal system temperature to inhibit both condensation and decomposition of gas vapor on the chamber surfaces. The material from which the liner is made preferably demonstrates chemical resistance to halogens and halogenated in situ cleaning compounds, and is preferably not adversely affected by, nor adversely affects, the process chemistry.

A chamber liner 28 is preferably disposed adjacent the inner wall 22 of the chamber to provide a removable surface within the chamber which can be easily cleaned and/or replaced. The liner 28 is supported in the chamber on supports 23, preferably three, which are equally spaced around the lower surface of the liner. The supports 23 are sized to minimize the contact area between the chamber liner 28 and the chamber body and thereby minimize heat conduction between the liner and the chamber body. In one embodiment, the liner is heated by radiation from the heated lid and the heated substrate support member. This embodiment is referred to as a passive floating liner. Alternatively, the liner may also include a resistive heater 25 (shown in FIG. 5), or other suitable heater, disposed therein so that it can be actively heated and maintained at an ideal isothermal temperature.

Figure 5:
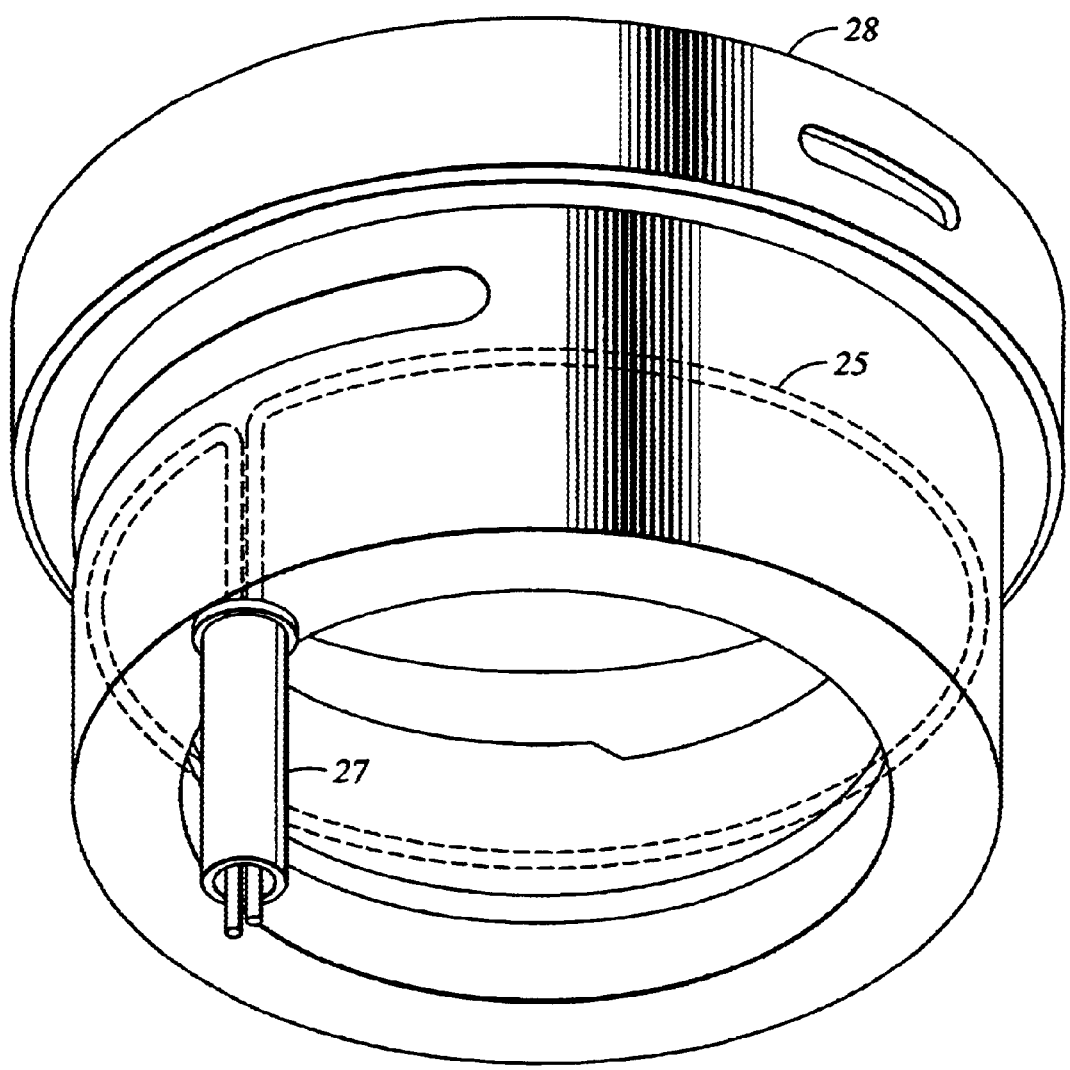
FIG. 5 is a substantially bottom perspective view of a chamber liner.

FIG. 5 is a substantially bottom perspective view of a heated liner 28 having a resistive heater 25 disposed therein and an electrical connector 27 mounted on the lower surface of the liner which houses the electrical connections to the coil. The actively heated embodiment is referred to as an active floating liner.

Figure 6:
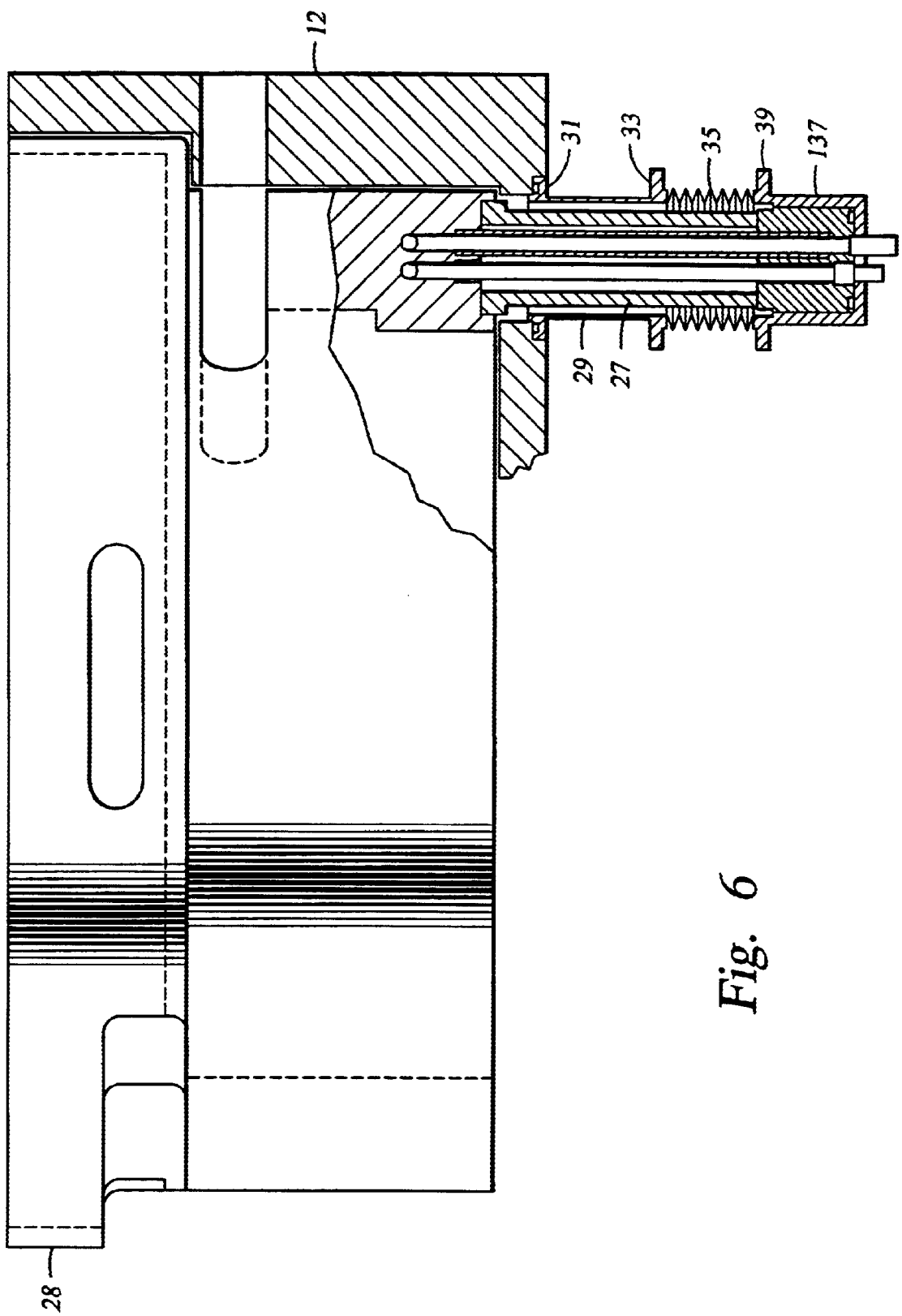
FIG. 6 is a cross sectional view of a chamber liner showing a connector for a resistive heating element.

FIG. 6 is a cross sectional view through the active floating liner 28 showing an external housing mounted on the bottom of the chamber through which the electrical connector 27 is disposed. Due to thermal expansion of the liner, accommodation of the expansion is preferably provided or resisted by the external housing mounted on the chamber. The external housing includes a first conduit 29 having a flange 31, 33 disposed on each end thereof for mounting to the bottom of the chamber and for mounting a bellows 35, respectively. The bellows is mounted on one end to the lower end of flange 33 and at the other end to a second conduit 137 at a flange 39 provided therefor. The bellows is sized and adapted to flex to accommodate any thermal expansion in the electrical connector 27 or the liner 28. The electrical connections to the coil extend through the end of the second conduit 137 for easy connection to a power source.

Since the portions of the liner below the substrate support member are typically isolated from the vapor flow, temperature control of these parts is less critical. However, the portion of the liner below the substrate support member may also be actively heated using a resistive type heating element, or other suitable heating member. The temperature of the liner both above and below the substrate support member should be maintainable preferably between about 200° C. and 750° C., and most preferably between about 200° C. and 300° C., or other temperature ranges suitable for the desired deposition material.

Referring to FIG. 2, a sealing edge ring 160 (shown in FIG. 2) is disposed in the chamber and supported on the substrate support member 24 to contact and overlap a circumferential edge of the substrate support member 24. A circumferential rib can be provided on the underside of the ring in order to maintain the ring in an aligned position. The edge ring serves to close-off the annular space 162 between the liner 28 and the substrate support member 24, and thereby substantially reduce the amount of deposition vapor which flows into the lower part of the deposition chamber. In addition, the edge ring acts as a radiation shield. The outer circumferential portion of the gas distribution plate 26 typically extends beyond the diameter of the substrate. The edge ring 160 protects this part of the gas distribution plate 26 from heat directly radiated by the substrate support member. The edge ring 160 is preferably made of a material having a thermal coefficient of expansion similar to that of the deposition material to reduce the possibility of particle generation due to flaking during thermal cycling. In the case of BST, one such edge ring material is titanium.

The lid assembly 14 preferably comprises a main body 70 machined or otherwise formed of a metal having a high thermal conductivity, e.g., aluminum. The main lid body defines an annular channel 74 formed around its perimeter to define a thin outer wall 76. A support ring 78, preferably made of stainless steel or other thermal insulator, is disposed in the channel to provide structural support for the lid and to prevent thermal conduction to the outer wall 76. The thin outer wall of the body member provides a thermal choke for the base 71 of the lid which is sealed to the chamber body during processing at the seal 72, such as an O-ring seal. The seal 72 is positioned at a circumferential interface of the chamber body 12 and the lid assembly to maintain a hermetic and vacuum tight seal of the chamber. In order to actively cool the seal, one or more cooling channels 73 are preferably disposed in the lower lip of the outer wall 76. A heat exchange fluid (e.g., water, ethylene glycol, silicone oil, etc.) circulates through the channel to remove heat at the seal.

The thermal choke provided by the thin outer wall 76 isolates the seal 72 between chamber lid assembly 14 and the chamber body 12 from the heat generated by heating elements 80 disposed in the lid. The heat choke provides thermal protection of the seal 72 by allowing localized active cooling within the channel on top of the O-ring 72, without inducing significant detrimental cooling effects on the other system components. The thin wall 76 presents an effective thermal barrier between the heating elements and the O-ring due to its small cross-sectional area (A) and long length (l).

The upper surface of the main lid body 70 defines a plurality of annular recesses 79, such as spiral grooves, for receipt of a heating element 80 therein. In a preferred embodiment, a heater with a power output of about 6200 W is used. However, the amount of power will vary depending on the lid design and geometry, including material composition of the lid, and the process temperature. Power is delivered to the heating elements through a feedthrough 85 disposed in the lid. The heater is preferably controlled with conventional PID feedback control, based on signals received from a thermocouple 82 positioned or otherwise disposed in the lid. An annular plate 84 serving as a heat shield is mounted on the top of the heating elements. Preferably, the plate 84 is brazed to the lid body to form an integral part of the lid body. A water cooled cover plate 86 is disposed on or over the plate 84 to provide a controlled mechanism for pulling heat out of the lid for active feedback temperature control.

A cooling channel 100 is preferably formed in top cover plate 86 of the lid assembly 14. Cooling channel 100 removes heat from the lid. In addition, a thermal choke gap, preferably about 25 mils, is used to control the amount of heat removed from the lid during cooling. During deposition of a material such as BST, the substrate will be heated by the substrate support member to a temperature of over 400° C. Heat from the substrate and the substrate support member will radiate onto the gas distribution plate 26 thereby tending to increase its temperature above the optimum isothermal system temperature. By increasing the thermal conduction or transfer between the lid and the gas distribution plate 26, the substrate and substrate support member induced temperature gradients and fluctuations can be reduced. In order to improve heat conductivity between the lid and the gas distribution plate 26, an inert gas (e.g. helium, hydrogen, etc.) is circulated about the annular interface of these elements. The inert gas is introduced into channel 102, which may be circular, spiral or other shape, disposed in the lid. The channel can be formed in the mating annular surface(s) of the gas distribution plate 26 and the main lid body 70 and/or in the cover plate 86. The inert gas can be introduced from the top through the cooling plate or through the bottom of the chamber via a feedthrough connected to the gas manifold. Gas pressure in the channels can be maintained within the range from about 1–100 Torr, preferably within the range of about 1 Torr to about 20 Torr. Due to its high thermal conductivity, the circulating inert gas can improve heat transfer between the lid assembly 14 and the gas distribution plate 26.

The lid assembly, including the heating element, is configured to maintain the vapor inlet passageway and gas distribution plate at an ideal isothermal system temperature, e.g., 270° C.±5°. Passive and active cooling elements are used to maintain the top cover of the lid, and the seal 72 positioned between the chamber body and the lid assembly, at a substantially lower temperature, e.g., 100° C. or lower.

The mixing gas manifold 46 includes a central opening 88 which delivers the gases to a blocker plate 90 to initially disperse or distribute the gas(es) over a large area above a face plate 92. Each of the blocker plate and the face plate have a plurality of holes formed therethrough which evenly disperse the gas over the area of the plates 90, 92 and together form the gas distribution plate 26. The face plate 92 delivers the gas uniformly over the area of a substrate positioned on the substrate support member 24. The gas distribution plate 26 and the mixing gas manifold 46 are preferably made of aluminum and are sufficiently thick to allow heat transfer from the gas distribution plate to the temperature controlled lid assembly 14.

With respect to the gas distribution plate assembly, the use of a conventional thin blocker plate 90 with a relatively thicker face plate 92 also serves as a thermal control system. The mixing gas manifold 46 serves as a heated mass whose heat capacity and high thermal conductivity act as a source of thermal inertia resisting temperature variations from the center of gas distribution plate to its periphery. The gas mixing manifold 46 also avoids the effects of gas "channeling" through the material of the plate for providing a more even distribution of gas volume across the substrate surface. While the gas distribution plate is preferably made of aluminum, another thermally conductive material may also be used.

Figure 7:
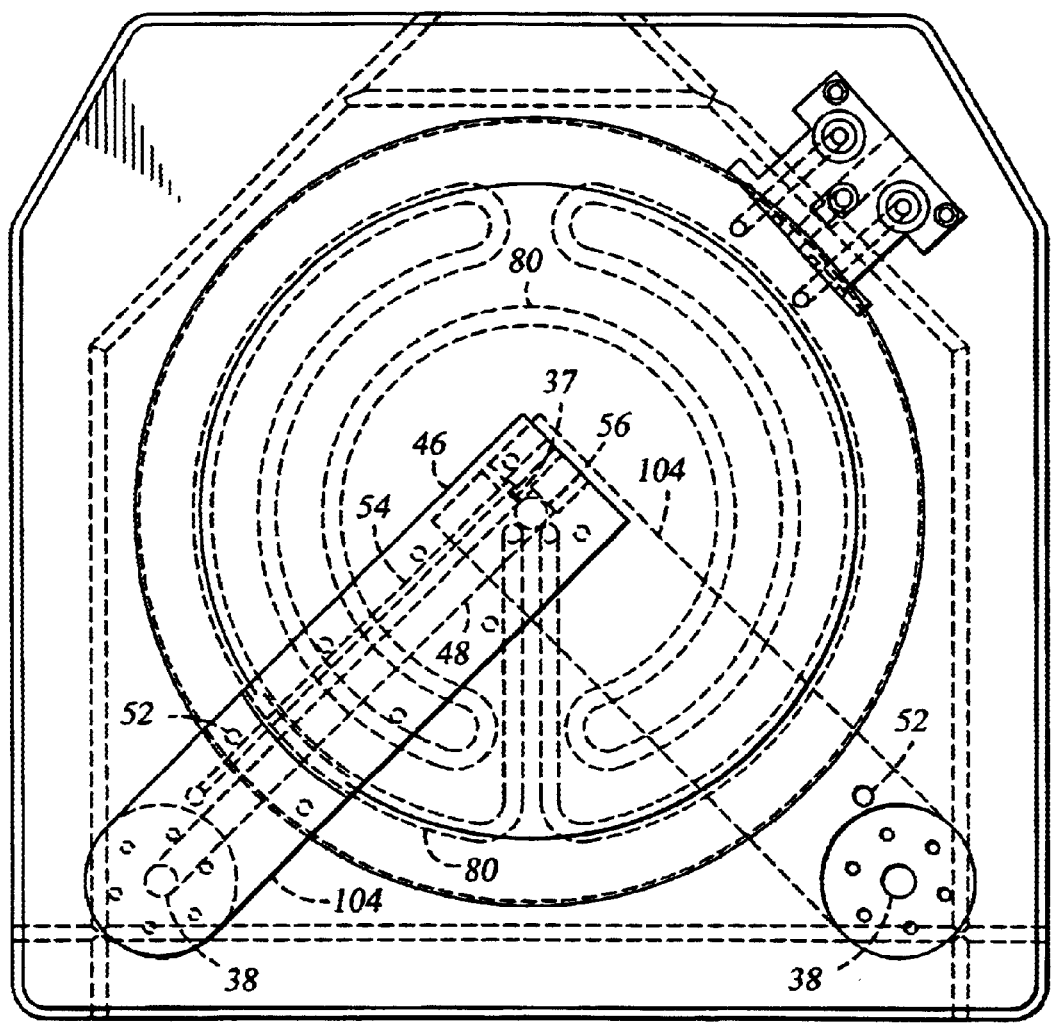
FIG. 7 is a top view of a lid of the present invention.

FIG. 7 is a top view of a chamber lid showing the heating element 80 and the mixing gas manifold 46. The lower surface of the lid body defines one or more channels 104 for mounting a gas manifold 46. One or more oxidizer gas passages 52, similar to passage 38, are also formed in the chamber body 12 adjacent the passage 38 for receiving an oxidizer gas delivery feedthrough which can be heated if desired to deliver one or more oxidizer gases through the chamber wall to the mixing gas manifold 46. A gas passage 54 is formed in the mixing gas manifold 46 to deliver the oxidizer gas to a gas outlet 56, which provides a mixing point, located in the gas manifold adjacent the entry port into the gas distribution plate 26. A restrictive gas passage 37 connects the end of the oxidizer gas passage 54 to the end of the vaporized gas passage 48 to provide high velocity delivery as well as mixing of the gas mixture upstream from the gas distribution plate 26.

FIG. 8 is a partial cross sectional view of a gas manifold 46. The gas manifold 46 includes a gas delivery block 61 which defines one or more gas passages 48, 54 therein having one or more gas inlets 38, 52 on one end and a gas outlet 56 on the other end. The gas outlet 56 serves as a gas inlet of the gas distribution plate 26.

Figure 9:
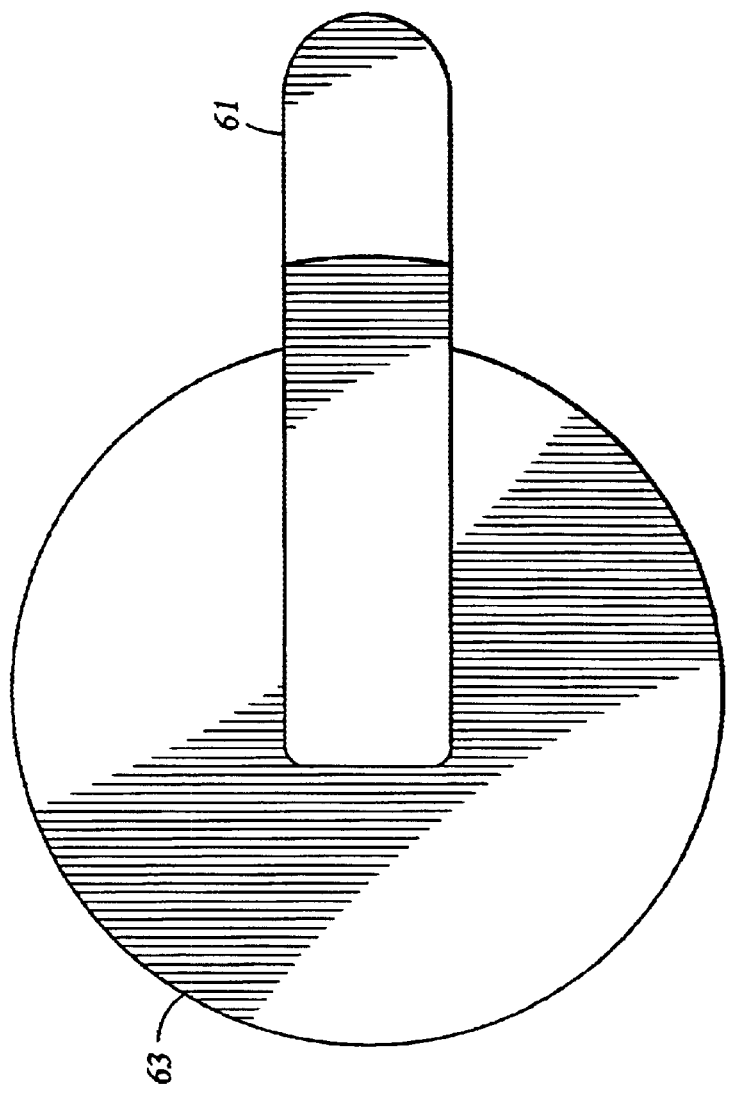
FIG. 9 is a top view of a gas manifold.

FIG. 9 is a top view of a gas manifold. An annular conductance restrictor plate 63 is mounted on the lower surface of the gas delivery block 61 (shown in FIG. 2) to mount the gas distribution plate 26 and prevent gas leakage at the interface between the gas manifold 46 and the gas distribution plate 26.

Figure 10:
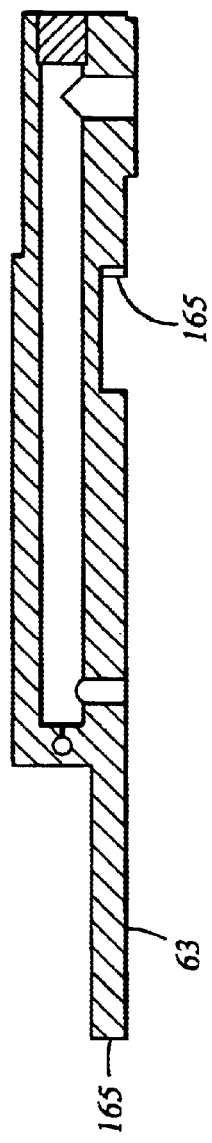
FIG. 10 is a cross sectional view of a gas manifold.

FIG. 10 is a cross sectional view of the gas manifold. The conductance restrictor plate 63 is sized and adapted to define an annular mounting recess 165 to which the gas distribution plate is secured.

Referring again to FIG. 8, a vaporized first gas passage 48 and an oxidizer gas passage 54 extend at least partially along the length of the gas manifold from the gas inlets to the gas outlet. The restricting gas passage 37 is disposed between the vapor gas passage and the oxidizer gas passage to optimally mix and deliver the oxidizer gas into the gas outlet and then to the blocker plate and face plate. The restrictive gas passage 37 delivers the oxidizer gas into the vaporized gas passage at a relatively high velocity to assist in mixing of the gases. Alternatively or additionally, a second set of a vaporized gas passage and an oxidizer gas passage, a carrier gas passage or a cleaning gas passage (to deliver a cleaning gas species from a remote plasma source) may also be provided through the chamber wall to deliver these gases to a second gas manifold.

FIG. 4 shows a partial cross sectional view of a pumping system 18 of the present invention. The pumping system 18 includes a pumping nose 106 mounted on the chamber which connects an exhaust passage and related pumps to the chamber. The pumping nose 106 includes a housing 108 which defines a gas passage 110 along its length. The housing supports a removable heated liner 112. Both the housing and the liner define a pair of ports 114, 116, one port 114 connected to a cold trap and exhaust pump and the other port 116 connected to a turbopump 118, or other high vacuum pump, with a gate valve 120 disposed therebetween.

The removable heated liner 112 is shaped and sized to slidably mount within the nose housing 108 and includes a mounting flange 122 on one end to mount to the end of the housing. A second mounting plate 123 is mounted on the first and sealed thereto using a seal 125. The exhaust liner includes a body 124 which defines a central gas passage 110 opening into the exhaust manifold in the chamber and the two exit ports, preferably connecting a high vacuum pump and an exhaust pump and related cold traps. Six mounting blocks 126, 128, 130 (three of which are shown) extend at least partially along the length of the central passage to mount four cartridge heaters 132 and two thermocouples 134. The multiple thermocouples provide a back up as well as enable checking temperature uniformity. In one embodiment, the thermocouples extend along the bottom of the liner while the heaters are disposed along the top and in the central portion of the liner. However, other configurations such as heaters on the top and bottom and thermocouples in the middle or heaters on the bottom and middle and thermocouples on the top are contemplated by the present invention. The heaters are preferably connected in parallel and two connections are provided on the mounting flange of the liner for easy connection to a power source. A cap may be mounted over the mounting plates when removed from the system so that the exhaust liner can be easily cleaned without the risk of jeopardizing the electrical connections to the heaters. The cap can be sealed to the second mounting plate 123 using an O-ring seal or other suitable seal. Also, a handle is preferably mounted on the second mounting plate to facilitate easy removal of the exhaust liner from the nose and submersion in a cleaning bath. Preferably, the second mounting plate 123 includes quick connects for the heaters and the thermocouple cables.

A deposition vapor inlet passageway 68 communicates directly with a vaporizer outlet port (shown in FIG. 2) can extend axially through the lid assembly 14. An annular recess surrounding the inlet passageway is formed on a top side of the main lid body.

FIG. 11 is a cross sectional view of an removable heated liner 112. The end of the liner adjacent mounting flange 122 includes a thin walled portion 136 around its circumference which acts as a thermal choke. The thermal choke ensures that an O-ring disposed between the mounting flange 122 and the exhaust housing is not subjected to elevated temperatures. Additionally, the thermal choke regulates the amount of heat transferred to the housing thereby minimizing (i.e., optimizing) the amount of power required to heat the liner. The end proximate the chamber is curved to match the curvilinear contour of the inner wall of the exhaust manifold. TEFLON® screws 138 are inserted at the chamber of the exhaust liner on at least the bottom and/or the sidewalls of the exhaust liner, preferably both, to provide a smooth surface on which the liner can slide on insertion into or removal from the housing to prevent scratching of the nose liner and/or housing. TEFLON® is preferred because the material can withstand 250° C. temperatures, does not outgas unwanted contaminants and is compatible with various aggressive cleaning solutions. However, screws or plugs formed of other materials possessing these characteristics can be used effectively. FIG. 12 is a front view of the second mounting flange 122 showing the heater and thermocouple connections and positions.

Referring to FIG. 4, a turbopump 118, or other high vacuum pump, is mounted to an outlet port 116 of the pumping nose. A gate valve 120 is disposed between the turbopump and the nose to enable selective communication of the turbopump with the chamber. The turbopump enables the vacuum chamber to be evacuated down to a very low pressure to be compatible with processing platforms such as an Endura® platform available from Applied Materials, Inc. of Santa Clara, Calif. An exhaust pump such as a roughing pump, dry pump or other pump used in the industry is connected to the chamber at the exhaust port 114 in the nose to pump the chamber during processing. A cold trap 140 is disposed in the conduit connecting the exhaust pump to filter out the deposition material which may be detrimental to the pump. Additionally, a second cold trap 142 is disposed below the first cold trap and is connected to a bypass line from the vaporizer. The bypass line and related cold trap allow the system to operate in a continuous flow made by allowing delivery of vaporized material thereto during wafer transfer.

FIG. 13 is a perspective view of a cold trap filter of the present invention. The cold trap is housed in a tubular housing 144 (shown in FIG. 1) and includes a filtering member 146 which includes a plurality of cooled passages 148 for condensation of material thereon. The filtering member includes a base portion 147 and a filtering portion 149. The filtering portion 149 includes the plurality of cooled passages 148 formed therein. A water inlet 151 and water outlet 153 are disposed in conduits 155, 157. The gases pass through the filtering member and continue through an exhaust passage deposed in communication with a central portion 150 of the filtering member. This structure enables gases to pass through the filtering portion 149 and on through the exhaust system. The housing 144 mounts a conduit connected to the exhaust pump having an inlet fluidically connected to the central chamber portion 150 so that the gases pass through the cold trap and continue on through the conduit to a disposal system.

A purge gas arrangement provides a purge gas in the lower part of the chamber resulting in a gas shield with upwardly directed flow of gas emanating from the bottom of the chamber. The gas shield strength is adjustable with a mass flow controller. Suitable purge gases include helium, argon and nitrogen, which can be introduced through a purge line and a circular manifold for distributing the gas evenly about the substrate support member and the elevator shaft, within the sealing bellows. The gas flow rate must be set relatively low, e.g., 50 sccm, in order to avoid interference with the deposition process. Additionally, the purge gas is directed into the exhaust plenum adjacent the liner and away from the edge of the wafer.

The Vaporizer

Figure 14:
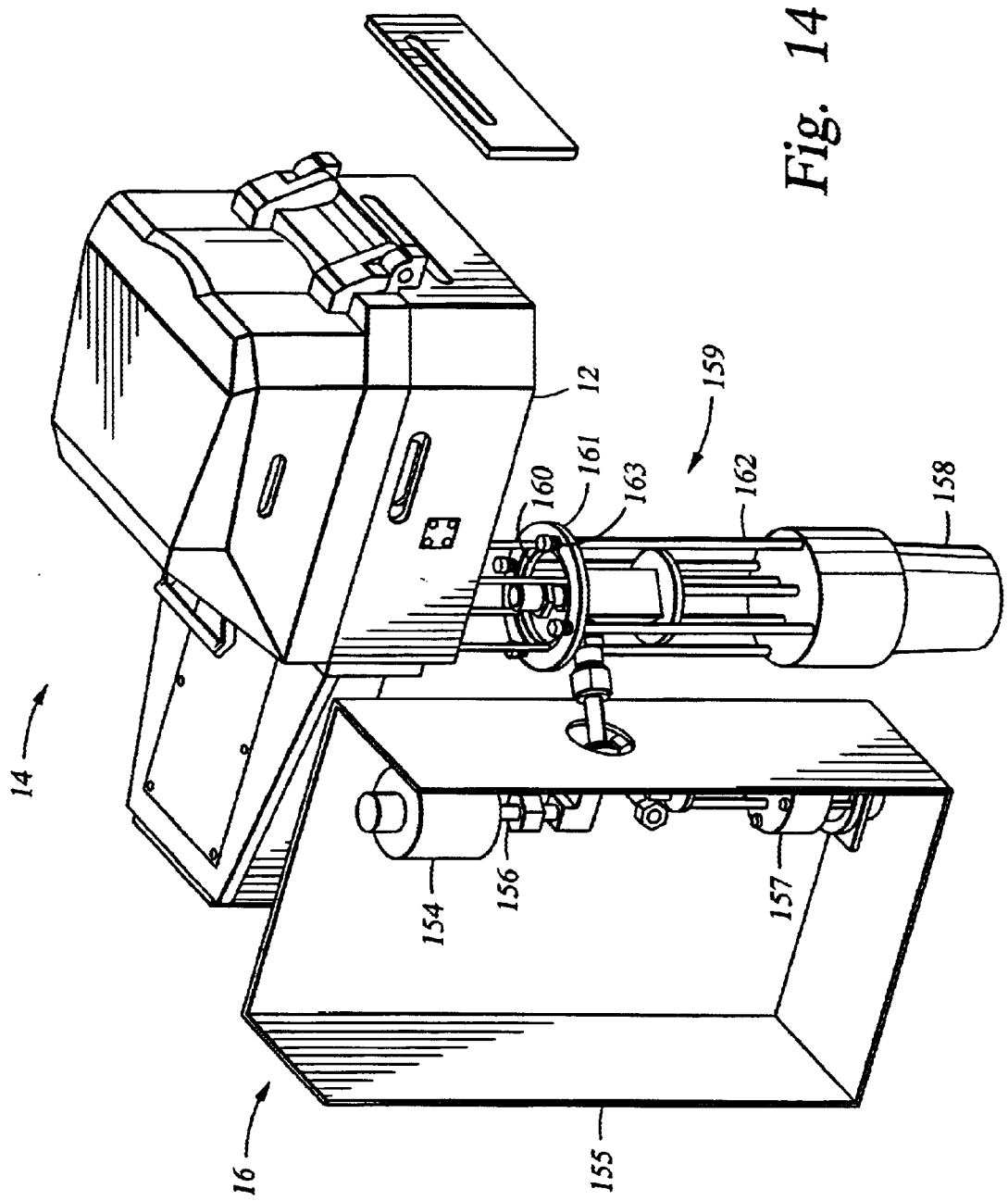
FIG. 14 is a perspective view of a chamber and vaporizer module.

FIG. 14 is a perspective view showing the vaporizing module 16 mounted adjacent to the chamber 12. A vaporizer 154 is mounted in a vaporizer cabinet 155 and includes an outlet line 156 connected to the inlet into the chamber. Disposed along the outlet line 156 is a first valve 157 which is connected in turn to a bypass line (not shown) extending out through the back of the cabinet 155 and is connected to the exhaust system by a conduit in which the cold trap 142 is disposed (see FIG. 1). The bypass line is adapted to deliver both vaporized gas as well as liquid solvent into a cold trap disposed downstream from the valve in preparation of delivering vaporized gas to the chamber or during cleaning of the system. This valve controls delivery of the vaporized material to the chamber or through the cold trap in the exhaust system. A second valve 158 is disposed downstream from the first valve to selectively deliver the vaporized gas into the chamber. The second valve is mounted to the lower portion of the chamber via a rod and washer assembly 159. This assembly enables adjustment of the delivery line as well as the valve in relation to the chamber. The mount generally includes first and second rings 160, 161, respectively, one disposed in the other, to allow rotatable adjustment of an second valve 158 and the delivery line. The second valve 158 is mounted to the second ring 161 via a plurality of rods 162 (four shown here) which are mounted from the ring and include a spring 163 disposed above the upper portion of the rod and the second ring 161. The two rings 160, 161 enable rotation of the assembly while the spring and rod arrangement allow vertical adjustment of the assembly to ensure proper alignment of the gas feed line 156 into the chamber through the feedthrough 40, shown in FIG. 2. In general, the suspension apparatus provides automatic compensation for thermal expansion/contraction to maintain vacuum seals without the mechanical and thermal stress.

Figure 15:
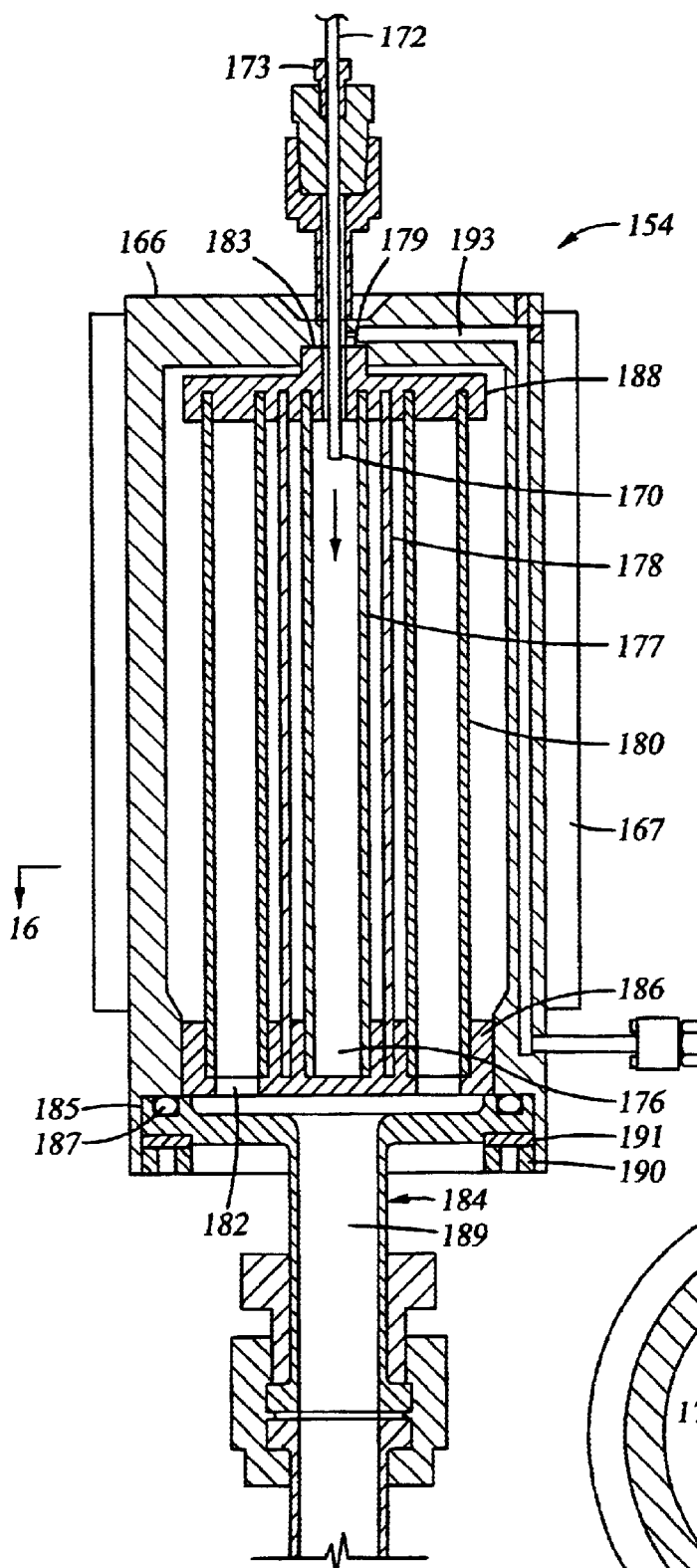
FIG. 15 is a cross sectional view of a vaporizer of the present invention.

FIG. 15 is a schematic cross sectional view of one embodiment of a vaporizer 154. The vaporizer generally includes an outer body 166 which houses one or more concentric vaporizing elements. The vaporizing elements have a porosity that allows the vaporized precursor fluids to pass therethrough, so that the precursor is vaporized and filtered contemporaneously. A heater 167, such as a band heater, is disposed around the outer perimeter of the outer body 166 and provides heat for vaporization of precursor liquids. An injection nozzle 170 is disposed through a nozzle adjuster 173 and is fluidicly coupled to an inlet port 172 of the vaporizer. The inlet port 172 allows precursor liquids preferably mixed with carrier gases, such as argon, to flow into the nozzle 170. A vacuum pump (not shown) is disposed downstream of the vaporizer to draw the fluids through the vaporizer. The nozzle adjuster 173 allows the nozzle height in the vaporizer 154 to be adjusted to fine tune the spray disbursement in the vaporizer.

An upper block 188 is disposed in an upper portion of the outer body 166 and engages a series of tubes 177, 178 and 180 on one end of the tubes. A lower block 186 is disposed in a lower portion of the outer body 166 and engages the other end of the tubes 177, 178 and 180. The upper block 188 is preferably made of a high temperature polymer, such as TEFLON®. The upper block 188 can include a protrusion 179 that mates with a recess 183 in the upper portion of the outer body 166 to assist in locating the upper block with the outer body. The lower block 186 is also preferably made of a high temperature polymer such as TEFLON® and engages the other ends of the tubes.

A main outlet 184 is disposed below the lower block 186 and includes an outlet flange 185 that extends toward the perimeter of the outer body 166. A seal 187, such as a "C" shaped seal made of TEFLON® having a stainless steel spring disposed concentrically within the "C", is disposed between the contacting surfaces of the outer body 166 and the outlet flange 185 to seal the interior portions of the outer body from ambient conditions. Alternatively, the seal 187 can be an O-ring. The main outlet 184 also includes an outlet tube 189 that defines a passageway for the vaporized precursor gases prior to the gas diffuser 46, shown in FIG. 2. A retainer ring 190 is disposed below the outlet flange 185 and threadably engages the outer body 166. A washer 191 is disposed between the retainer ring 190 and the outlet flange 185. As the retainer ring 190 is threaded into the outer body 166, the ring 190 exerts a compressive force on the lower body 186, tubes 177, 178 and 180, and the upper block 188 to effect a seal therebetween.

The nozzle 170 protrudes into the outer body 166, through the upper block 188, and into a space surrounded by a distributor tube 177. The distributor tube 177 is preferably made of stainless steel or other non-reactive material to the precursor fluids, similar to the materials described for filter tube 270 shown in FIG. 3A, and has a porosity of about 75 $\mu$m or more, preferably about 100 $\mu$m, through about the upper two-thirds of the tube and a series of holes of about 0.062 inches in diameter in about the lower one-third of the tube. Other sizes and porosity can be used, such as between about 0.02 to about 0.2 inches across the holes. The tube can be made of sintered material to achieve the porosity. Surface texture, such as grooves generated for example by threads, or other surface structures can also provide additional surface area and can increase the "wicking" of the sprayed liquid around the distributor tube 177. A cup 176 is disposed at the lower end of the distributor tube 177 and forms a central receptacle for liquids that are not vaporized on the wall of the distribution tube 177. The precursor liquids sprayed from the nozzle 170 are dispersed on the inner wall of the distributor tube 177. The distributor tube 177 is heated from the heat of the heater 167 through the outer body 166 and the lower block 186 that engages the distributor tube 177. As the precursor liquids contact the inner wall, the liquids "flash" or vaporize into gases. Excess liquids not immediately vaporized can accumulate at the bottom of the distributor tube 177 in the cup 176. The porosity of the distributor tube 177 allows the flashed gases to flow through the distributor tube for subsequent filtration in subsequent stages. The holes in the lower one-third of the distributor tube 177 provide an outlet for the vaporized gases and/or liquids through the distributor tube 177 to also be filtered in subsequent stages.

A second tube 178 is disposed concentrically about the distributor tube 177. Each end of the second tube 178 is sealably engaged with the upper block 188 and the lower block 186. The second tube 178 can also be made of stainless steel with a porosity of about 100 $\mu$m, although other materials and porosities can be used depending on the desired level of filtration and the precursors used. The gases and/or liquids distributed through the distributor tube 177 are filtered through the second tube 178. The second tube is also heated, similar to the distributor tube 177, and assists in vaporizing any remaining liquids flowing from the distributor tube 177.

One or more tubes 180 are disposed between the second tube 178 and the inner wall of the outer body 166 and surround the second tube. The tubes 180 can also be made of similar materials as the distributor tube 177, but preferably have a lower porosity of about 5 $\mu$m to about 20 $\mu$m for higher levels of filtration, i.e., about one order of magnitude less than the second tube 178 and/or distributor tube 177. The pressure drop can be similar to those pressure drops described in reference to the feedthrough shown in FIGS. 3a and 3b. The inner surfaces of the tubes 180 are substantially sealed from precursor fluids filtered through the second tube 178 to force the fluids through the porous filtering media. The lower end of the tubes 180 exhaust into one or more outlet ports 182. The outlet ports 182 exhaust into the main outlet 184. The precursor fluids are filtered through the tubes 180 having a lower porosity and enter the outlet ports 182 and the main outlet 184 for delivery to the gas manifold 46, shown in FIG. 2.

Preferably, the outer body 166 includes a carrier gas supply passageway 193 coupled to a gas inlet 168. The passageway 193 is disposed longitudinally along the wall of the outer body 166 adjacent the heater 167 and then radially into an upper portion of the outer body adjacent the nozzle 170. The passageway 193 allows carrier gas to be preheated and flown along the nozzle into the outer body 166 and into the interior of the distributor tube 177. The carrier gas assists in dispersing any droplets of precursor fluid that "wick" up the nozzle 170.

Figure 16:
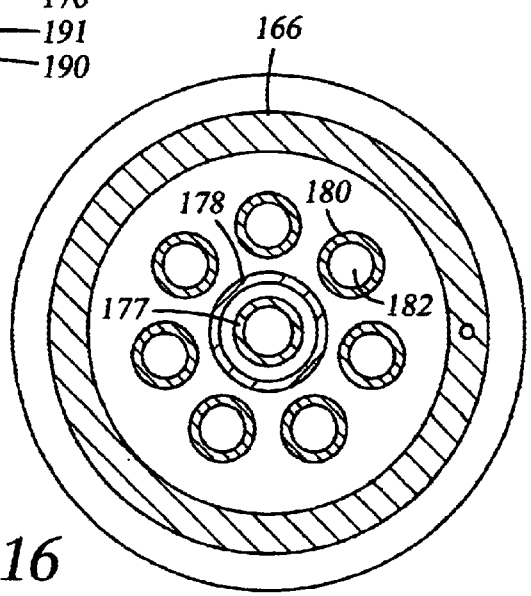
FIG. 16 is a schematic top view of the vaporizer.

FIG. 16 is a schematic cross sectional view of the outer body 166. The distributor tube 177 is disposed toward the center of the outer body 166 and surrounded by the second tube 178. One or more tubes 180 are angularly disposed between the second tube 178 and an interior wall of the outer body 166. Each tube 180 preferably is coupled to an outlet port 182.

Figure 17:
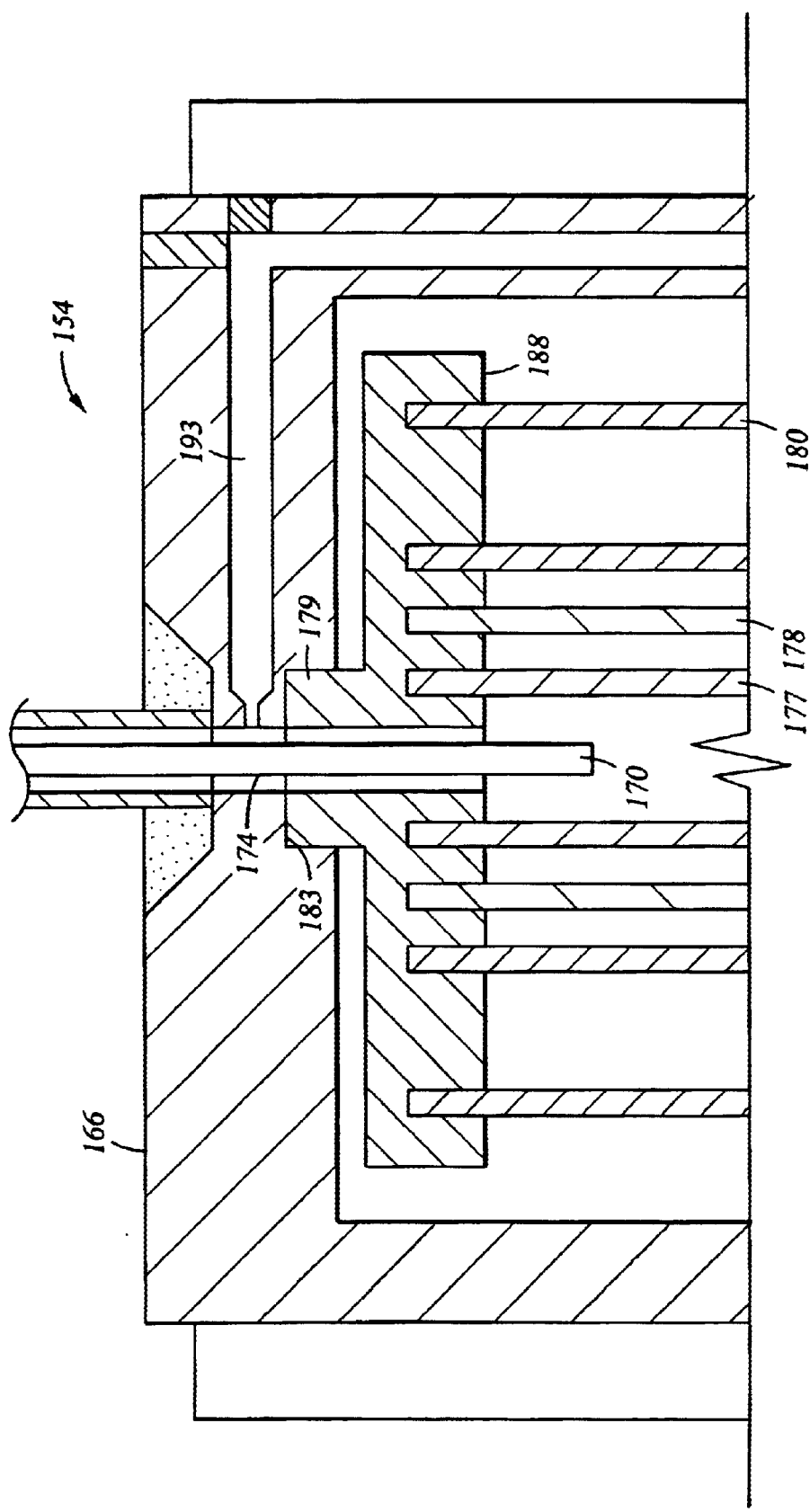
FIG. 17 is a schematic cross sectional view of an upper portion of the vaporizer.

FIG. 17 is a schematic cross sectional view of an upper portion of the outer body 166 and upper block 188. The nozzle 170 extends through the outer body 166, through the upper block 188, and into the inner space of the distributor tube 177. The distributor tube 177 is surrounded by the second tube 178 and one or more tubes 180 are disposed between the second tube 178 and the outer body 166. A protrusion 179 of the upper block 188 is received by the recess 183 in the outer body 166 to align the upper block 188 with the outer body 166. The carrier gas passage 193 is fluidicly coupled to a concentric annular passageway 174 surrounding the nozzle 170 to deliver one or more carrier gases to the tip of the nozzle. Preferably, the concentric gas passage is made of PTFE for low friction coefficient and prevention of clogging. The carrier gases are flown concentrically about the nozzle to prevent liquid droplets from forming on the tip of the nozzle and moving up the outer cylinder of the nozzle 170. The liquid delivered to the nozzle 170 is carried in a carrier gas, such as argon.

Adjustment of the flash vaporization to avoid a liquid droplet "dance on the frying pan" effect is obtained by adjusting the height of the nozzle 170 in the distributor tube 177 and the flow rate of the carrier gas and liquid precursor mixture. Any liquid droplets remaining after the initial "flash" vaporization are vaporized as the mixture advances through the vaporizing elements, i.e., the filter tubes. The resultant deposition gas then passes through the outlet ports 182 to the central main outlet 184 for delivery to the deposition chamber. The mixture is substantially maintained at the predetermined optimum isothermal system temperature (e.g., 270° C.±5°). The exhaust ports are designed for large conductance so that precursor vapors are readily carried from the vaporizer into the chamber.

The vaporizer 154 operates to vaporize a mixture of precursor components, such as BST and a carrier gas, by providing a vaporizer with increased surface area which exposes the mixture to a large area of evenly heated surfaces and filters out liquid droplets entrained in the flow by droplet impacting during changes in gas flow direction through the vaporizing elements. The flow velocity, and therefore impacting filtering efficiency, is independently controlled by the flow of an auxiliary argon or other carrier gas input to the vaporizer injection plumbing. In contrast to conventional arrangements, the amount of heating, e.g., vaporizing, power supplied to the mixture can be set substantially higher than the level of power actually required to achieve complete vaporization. The amount of power required for complete vaporization is a function of the chemistry of the precursor components and carrier gas and the flow rate of the mixture. As one example, with a BST flow rate of 0.10 ml/min and a carrier gas, e.g., Ar, and a flow rate of about 200 sccm to about 300 sccm, the amount of power necessary to heat and completely vaporize the flow is approximately 10 W. A metering valve can be used to control the amount of gas flow in direct relation to the flow rate of the liquid precursor component mixture.

Preferably, the thermal power transferred to the vaporizer 154 is set to be one to two orders of magnitude higher than the 10 W required for complete vaporization of the mixture, i.e., between about 100 W and about 1000 W, and preferably about 20 to about 30 times higher, i.e., about 200 W to about 300 W. Thus, the heating power absorbed by the flowing mixture is a fraction of the heating power which is available. The power absorbed by the gas vapor presents at most a small perturbation in relation to the available heating power, making it possible to substantially maintain an isothermal temperature (e.g., 270° C.±5°) of the heating surfaces. In general, depending on the precursor component mixture which is used, the ideal isothermal system temperature will be in the range of about 200° C. to about 300° C.

The heater 167 preferably delivers a total heating power of between about 1000 W and 3000 W to the outer body 166 and thus to the upper and lower blocks. The heater is controlled to maintain the main vaporizing section at the optimum isothermal temperature by a conventional PID controller. The controller is connected with a thermocouple positioned within the outer body 166 to monitor the temperature.

Figure 18:
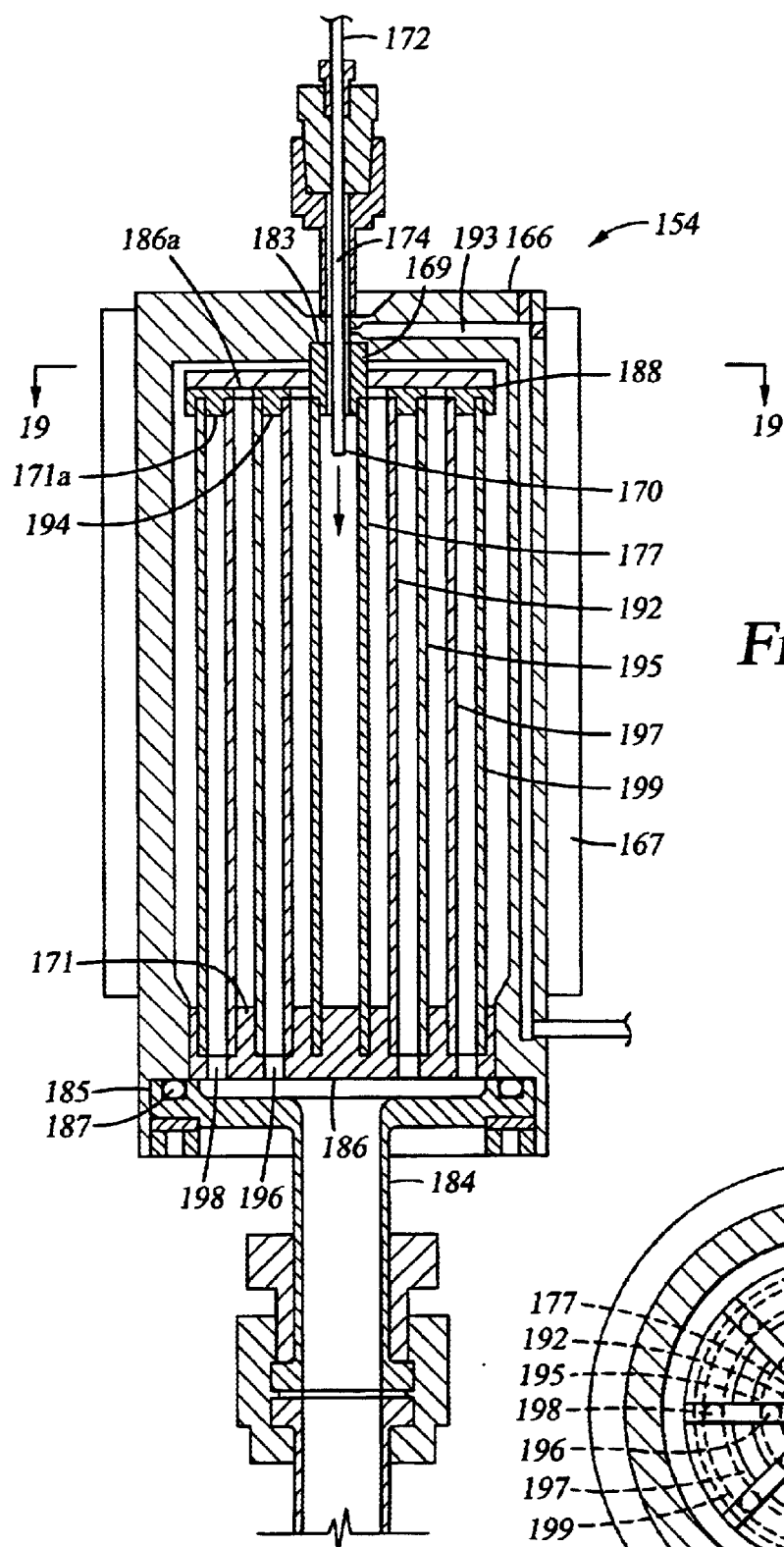
FIG. 18 is a cross sectional view of another embodiment of a vaporizer.

FIG. 18 is a schematic cross sectional view of another embodiment of the vaporizer 154. A hollow outer body 166 is coupled to a heater 167. A nozzle 170 is disposed from an inlet 172 through the outer body 166, through a guide plug 169 and into an inner portion of a distributor tube 177 as described in reference to FIG. 15. A carrier gas passage 193 is fluidicly coupled to a concentric passage 174 that surrounds the nozzle 170 and is defined in the outer body 166 and the guide plug 169. An upper portion of the guide plug 169 is received into a recess 183 in the outer body 166. A lower portion of the guide plug 169 is coupled to an upper plate 186a that is disposed in an upper portion of the outer body 166. The guide plug assists in aligning the upper plate 186a with the outer body 166. A lower block 186 is disposed in a lower portion of the outer body 166.

A series of concentric tubes, forming the filtering portion of the vaporizer, is disposed between the upper plate 186a and the lower block 186. A distributor tube 177, disposed between the upper plate and lower block, surrounds the outlet of the nozzle 170. A first pair of tubes having an inner tube 192 and an outer tube 195 concentrically surround the distributor tube 177. The first pair of tubes can be made of similar material as the tubes shown in FIG. 15 and preferably has a large porosity of about 100 μm. An annular plug 194, preferably made of TEFLON®, separates and seals the first pair of tubes at the upper ends of the tubes. The gases and any remaining liquid flown from the distributor tube 177 are filtered through the inner tube 192. A passage 196 is defined between the inner tube 192 and the outer tube 195, and is fluidically coupled to a main outlet 184.

A second pair of tubes is disposed around the first pair of tubes and includes an inner tube 197 and an outer tube 199. The second pair of tubes can be made of similar material as the first pair of tubes and preferably has a small porosity, such as between about 5 to about 20 μm and preferably about 10 μm. An annular plug 171a, preferably made of TEFLON®, separates and seals the second pair of tubes at the upper ends of the tubes. Another annular plug 171 separates and seals between the first pair of tubes and the second pair of tubes at the lower end of the tubes. The gases and any remaining liquid flown from the outer tube 195 of the first pair of tubes are filtered through the inner tube 197 of the second pair of tubes. A passage 198 is defined between the inner tube 197 and the outer tube 199 of the second pair and is fluidically coupled to an main outlet 184.

Figure 19:
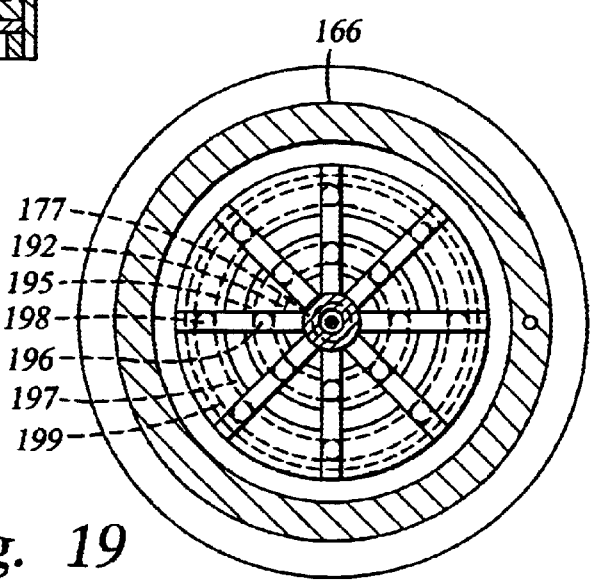
FIG. 19 is a schematic top view of the vaporizer shown in FIG. 18.

FIG. 19 is a top view of the vaporizer 154 shown in FIG. 18. The distributor tube 177 is concentrically surrounded by the inner tube 192 and then the outer tube 195 of the first pair of tubes. An passage 196 is defined between the inner tube and the outer tube of the first pair of tubes. The outer tube 195 is concentrically surrounded by the inner tube 197 and then the outer tube 199 of the second pair of tubes. An passage 198 is defined between the inner tube and the outer tube of the second pair of tubes.

Figure 20:
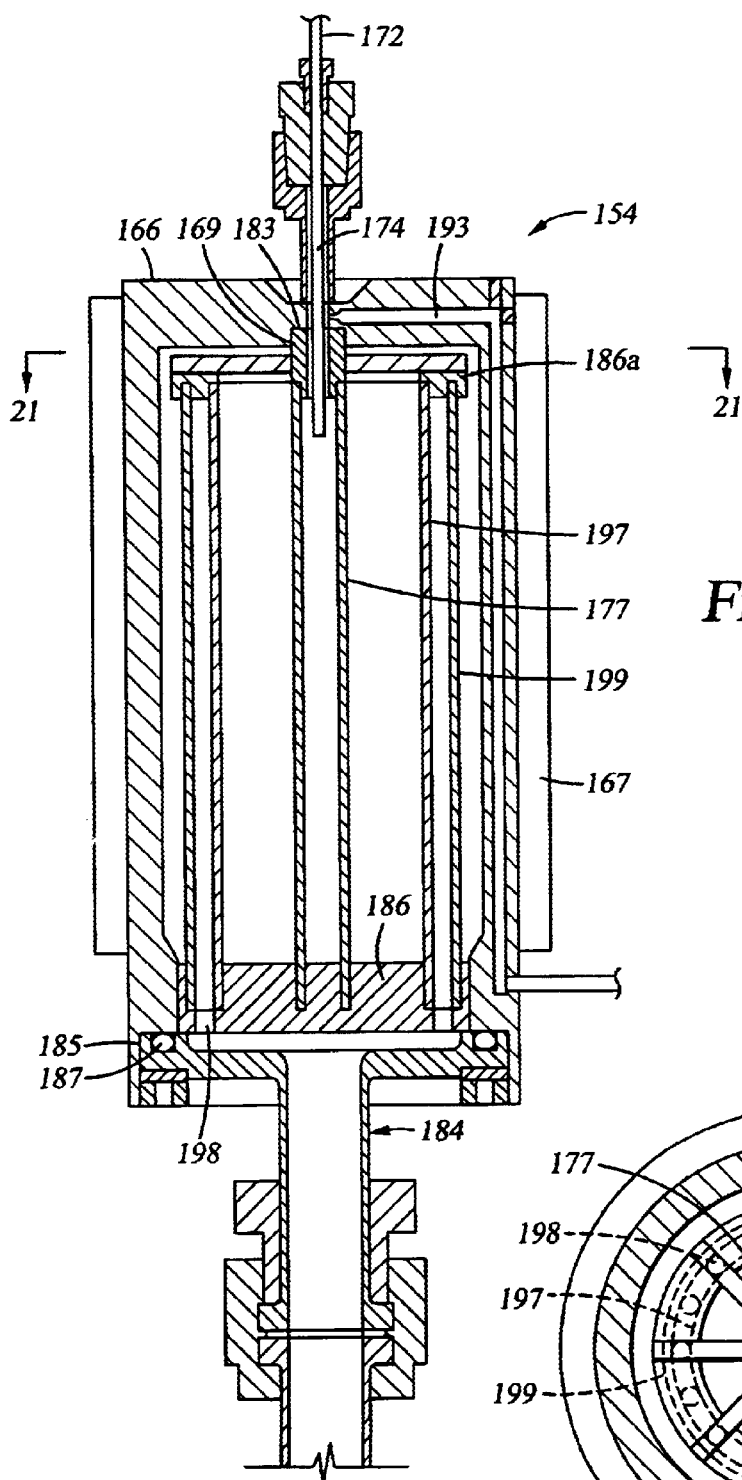
FIG. 20 is a cross sectional view of another embodiment of a vaporizer.

FIG. 20 is a schematic cross sectional view of another embodiment of the vaporizer 154. The vaporizer is similar to the vaporizer described in reference to FIGS. 18 and 19 without the first pair of tubes 192, 195 and passage 198. The pair of tubes 197, 199 are concentrically surround the distributor tube 177 and have a preferable porosity of between about 5 μm to about 20 μm and preferably about 10 μm. An passage 198 is fluidically coupled to the main outlet 184 and provides an exhaust port for the gases filtered through the tubes.

Figure 21:
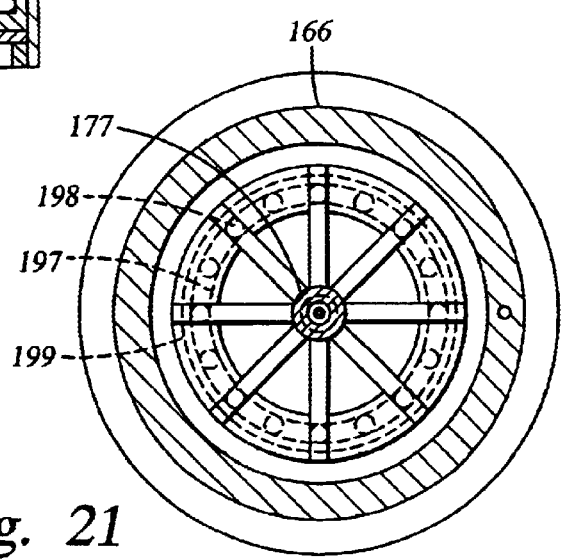
FIG. 21 is a schematic top view of the vaporizer shown in FIG. 20.

FIG. 21 is a schematic top view of the vaporizer, shown in FIG. 20. A distributor tube 177 is concentrically surrounded by the pair of tubes 197, 199. A passage 198 is defined between the tubes 197, 199.

Precursor liquids are sprayed from the nozzle 170 into the distributor tube 177. The distributor tube 177, heated by the heater 167, "flash" vaporizes the liquids and gases. Carrier gas, also heated by the heater 167 and introduced from the carrier gas passageway 193, and carrier gas entrained with the precursor liquid is forced along the inner wall of the distributor tube 177 and can flow through the holes in the distributor tube. The vaporized gases and any remaining liquid is passed to the first pair of tubes for filtration and vaporization of the liquid. The gases enter through the inner tube 192 of the first pair of tubes and exhaust through passage 198 into the main outlet 184 for delivery to the deposition chamber. Some gases and/or liquids exhaust through the outer tube 195 of the first pair of tubes and then are filtered through the inner tube 198 of the second pair of tubes. Gases exhaust through passage 196 into the main outlet 184.

Applications of the System

Exemplary metal-oxide layers which can be deposited using the present system may include tantalum pentoxide (Ta$_2$O$_5$), a zirconate titanate (ZrxTiy Oz), strontium titanate (SrTiO$_3$), barium strontium titanate (BST), lead zirconate titanate (PZT), lanthanum-doped PZT, bismuth titanate (Bi$_4$Ti$_3$O$_{12}$), barium titanate (BaTiO$_3$), BST, PZT, lanthanum-doped PZT, or the like. Other materials which can be deposited include those materials having a narrow range between vaporization and decomposition.

Substrates used in the present invention include primarily P-type and N-type silicon. Depending on the particular process chemistry and desired end product, other substrate materials may be usable, including other semiconductors, e.g., germanium, diamond, compound semiconductors, e.g., GaAs, InP, Si/Ge, SiC, and ceramics.

The selection of materials for the layers above the circuit element in an integrated circuit device depends on the device that is formed and other layers that a particular layer currently or subsequently contacts. For example, a DRAM requires a high▲permittivity capacitor, but the metal-oxide dielectric layer does not need to have ferroelectric properties.

Devices that can be made with the present system include, but are not limited to, 64 Mbit, 256 Mbit, 1 Gbit and 4 Gbit DRAMs.

The system also has particular application with other liquid precursors which are volatile as well as materials such as copper.

Liquid Delivery System

Figure 22:
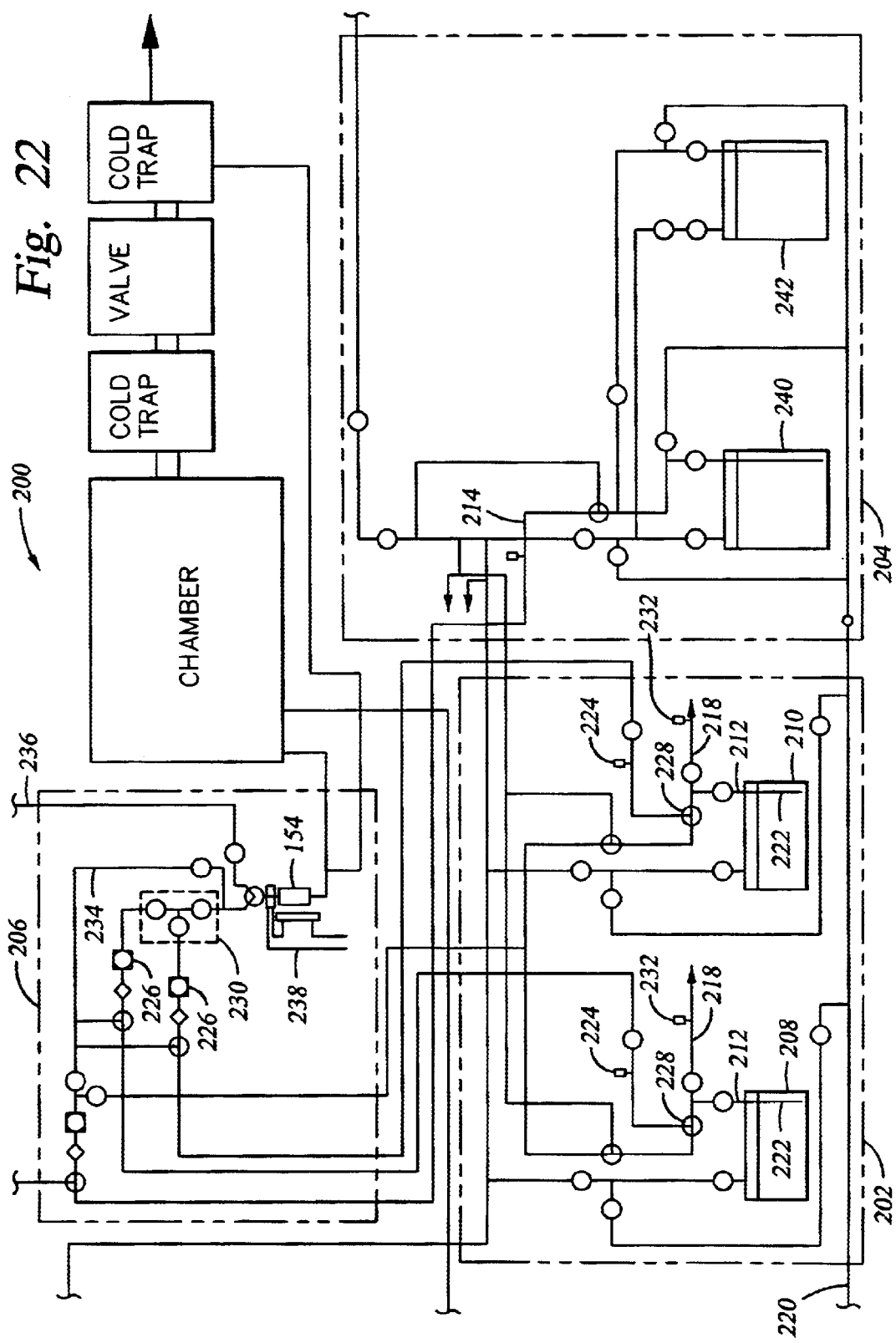
FIG. 22 is a schematic of a liquid delivery system.

FIG. 22 is a schematic of a liquid delivery system 200. The liquid delivery system generally includes a liquid precursor module 202, a solvent module 204 and a vaporizer module 206. In one embodiment, the liquid precursor module 202 includes two pressurized ampoules 208, 210 and a liquid delivery line 212 connected to each ampoule. Valves are disposed along the length of the liquid delivery lines to control flow of liquid from the ampoules to a mixing port and then into the vaporizer. Preferably, zero dead volume valves, which are described below, are used to prevent collection of precursor therein which can compromise the valves as well as negatively affect process stabilization and/or repeatability. The zero dead volume valves enable rapid flushing of precursor from the lines using solvent. Solvent is plumbed to the liquid delivery line 212 by line 214 to flush the system during maintenance. Additionally, a purge gas line is plumbed to the liquid delivery line to rapidly purge solvent from the line so that the system, including the ampoules, valves and/or LFCs, can be prepared for maintenance in ten (10) to thirty (30) minutes. The valving is designed so that when necessary, solvent can be introduced into the liquid delivery line upstream form the mixing port to flush the line through a bypass line 218 and out through a recovery system which includes a cold trap and exhaust manifold.

The ampoules are designed to deliver the liquid precursors at high pressure, e.g., up to 500 psi, without having to rely on high pressure pumps, i.e., no high cycle mechanical pump with rubbing parts exposed to precursors. To provide the pressure, an inert gas such as argon is charged into the ampoules at a pressure of about 90 psi through line 220. A liquid outlet line 222 is disposed in the ampoule so that as the inert gas, e.g., argon, is delivered to the ampoule and the appropriate valves are opened, the liquid is forced out through the outlet through a suitable valve and into the liquid delivery line.

The liquid delivery line 212 is connected from each ampoule to the vaporizer. A first zero dead volume valve is disposed on the outlet of the ampoule to control delivery of the liquid to the delivery line 212. The valve is preferably a three-way valve connecting the bypass line 218 and the liquid delivery line 212. The bypass line 218 in turn is connected to a cold trap and an exhaust manifold (not shown). A high pressure gauge 224 and a LFC 226 are disposed downstream from a valve 228 introducing the solvent and the purge gas. The LFC controls delivery of the liquid to the mixing port 230 connected between the liquid precursor delivery lines. A low pressure gauge 232 is disposed on the bypass line 218 to monitor pressure in the line so that completion of the maintenance routine can be determined.

The liquid precursor delivery lines 212 deliver liquid precursors into the mixing port 230 upstream from the vaporizer 154. A solvent delivery line 234 also delivers a solvent into the liquid delivery line downstream from the mixing port where the liquid precursors and the solvent are mixed and delivered into the vaporizer. At the vaporizer, a carrier gas line 236 delivers a carrier gas into the delivery line to carry the liquid precursors and the solvent into the vaporizer through the capillary tube or nozzle. In addition, a concentric carrier gas line 238 delivers a carrier gas around the nozzle or injection tip to ensure that even a small amount of liquid is delivered to the vaporizing surfaces. The delivery line from the mixing port and into the vaporizer is preferably made of a material having a low coefficient of friction, such as TEFLON® PTFE to reduce clogging in the line. The low coefficient of friction assists in the delivery of small volumes of liquid precursor.

The solvent module 204 includes one or more chargeable ampoules similar to the liquid precursor ampoules. Preferably, there are two solvent ampoules 240, 242 and two liquid precursor ampoules 208, 210. The liquid precursor ampoules can deliver two separate precursors which can be mixed at the mixing port or can deliver the same precursor together or alternatively.

The liquid precursor ampoules are designed with a slotted/sculptured bottom to draw the liquid downwardly in the ampule so that the liquid may be detected at very low levels and drawn out of the ampule even at low levels. Detection and delivery at low levels is particularly important in processing with expensive liquids to avoid waste. In addition, the ampoules include an ultrasonic detector for discerning the volume of liquid in the ampule even at low levels so that continuous processing may be achieved.

Figure 23:
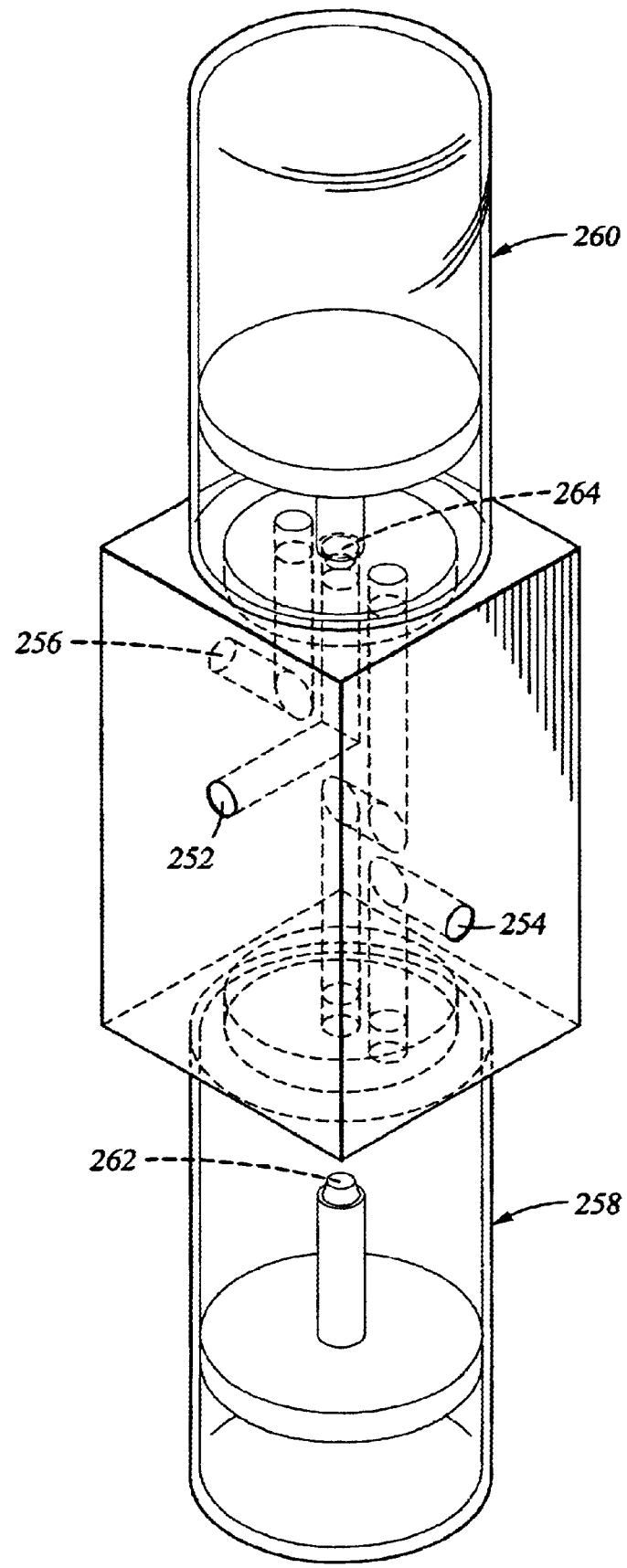
FIG. 23 is a perspective view of a zero dead volume valve.
Figure 24:
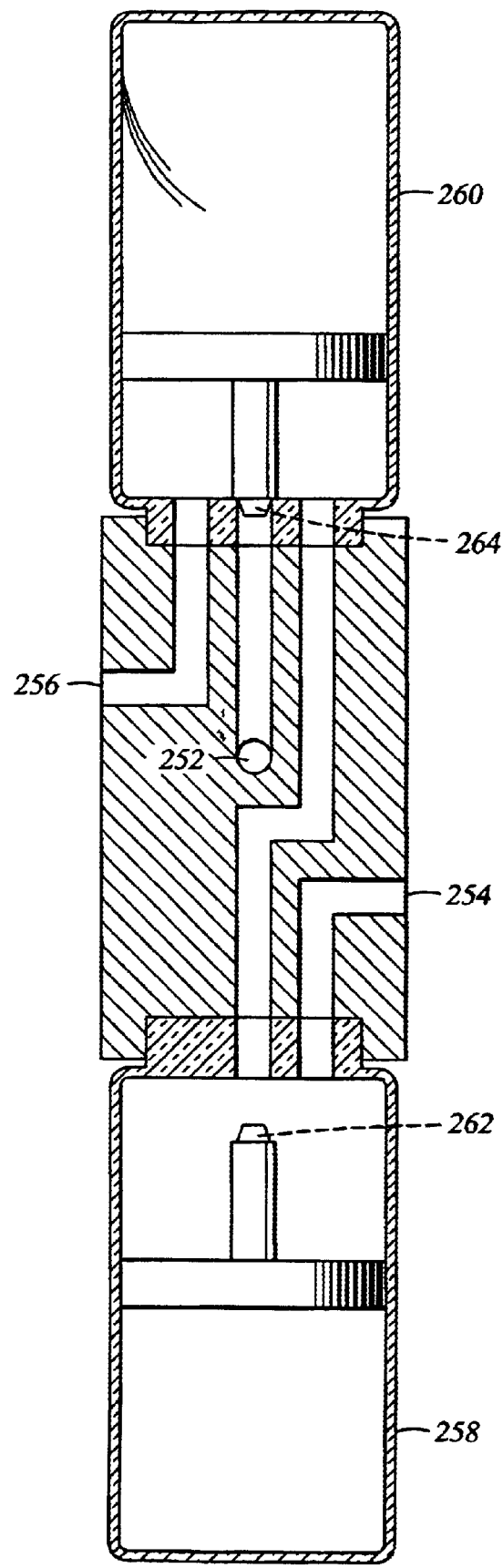
FIG. 24 is a cross sectional view of a zero dead volume valve.

FIG. 23 is a perspective view of a zero dead volume valve. The valve includes a liquid precursor inlet 252 and a solvent inlet 254 and a single outlet 256. The solvent is routed through the solvent inlet through a solvent control actuator 258 and into the liquid precursor control actuator 260. A plunger 262 controls entry of the solvent into and consequently out of the solvent control actuator as shown in FIG. 20. The liquid precursor is routed through the precursor inlet 252 and into precursor control actuator 260 when the plunger 264 in the actuator is in the open position. When the plunger is in the closed position, the precursor is prevented from entering the actuator and is flushed out of the valve by the plunger and by flow of solvent through the valve. The solvent is able to enter the precursor control actuator 260 whether the plunger is in the open or closed position to enable solvent purge of the valve as shown in FIG. 24. The plunger is contoured to seal the liquid precursor inlet while enabling solvent flow into the actuator. Continuous solvent flow allows the system to be continuously purged with solvent when the liquid precursors are shut off.

Additionally, a single actuator valve is disposed on the outlets of the ampules to control delivery of liquid precursor and to prevent clogging in the actuator. Also, the two way valves are preferably disposed on the downstream side of the liquid flow controllers in the vaporizer panel.

The delivery tubes are preferably made of a material such as TEFLON® to promote frictionless fluid flow therein to prevent clogging and deposition along the path of the tubes. It has been learned that TEFLON® provides a better conduit for materials such as the barium, strontium and titanium precursor liquids used in the deposition of BST.

The plumbing system is designed to enable rapid flushing of the lines and valves during routine maintenance. Additionally, the system is adapted to enable sequential shutdown of each of the valves as well as to deliver an automatic flush of a controlled amount of solvent through the vaporizer and the delivery lines in case of a power outage. This safety feature ensures that during uncontrolled power outages, the system will not be subject to clogging.

The delivery system may also comprise a bubbler system where a carrier gas such as argon can be bubbled through a solvent to suppress premature solvent evaporation from the precursor, thereby ensuring the precursor liquid will not be dried out en route to the vaporizer.

In situ liquid flow controllers and pisoelectric control valves are also used to maintain heightened control over the system. The high pressure gauges present on precursor and solvent lines as well as vacuum gauges on the vacuum manifolds are used to measure whether chemicals remain in the lines. These gauges are also used for on board leak integrity measurements.

A preferred embodiment of the present invention includes a liquid CVD component delivery system having two pressurized ampoules of liquid CVD component and a related LFC, such as a needle valve, which operates without sliding seals and can be used at pressures of less than 250 psi. Two solvent ampoules deliver solvent into the liquid delivery lines for cleaning and maintenance as well as into the mixing port during processing.

BST Process

The vapor desired for use in the deposition process is shown as a mix of first and second vaporized liquid precursors combined in predetermined mass or molar proportions. For use in deposition of BST, the first liquid precursor is preferably one of a mixture of Ba and Sr polyamine compounds in a suitable solvent such as butyl acetate. The preferred mixtures combine bis(tetra methyl heptandionate) barium penta methyl diethylene triamine, commonly known as Ba PMDET $(tmhd)_2$, and bis(tetra methyl heptandionate) strontium penta methyl diethylene triamine, commonly known as Sr PMDET $(tmhd)_2$, or, in the alternative, bis(tetra methyl heptandionate) barium tetraglyme, commonly known as Ba $(tmhd)_2$ tetraglyme, and bis(tetra methyl heptandionate) strontium tetraglyme, commonly known as Sr $(tmhd)_2$ tetraglyme. The second liquid precursor is preferably bis(tetra methyl heptandionate) bis isopropanide titanium, commonly known as Ti (I-pr-o)$(tmhd)_2$, or other titanium metal organic sources, such as Ti$(tBuO)_2(tmhd)_2$. The molar ratio between the combined metals in the first liquid precursor and the second liquid precursor is preferably about 2:1:4 Ba:Sr:Ti. The molar ratio can vary from about 2:1:2 to about 2:1:8. Other precursors that could be used include precursors without the penta methyl diethylene triamine (PMDET) component. A suitable solvent for such precursors could be tetrahydrofuran (THF).

The BST process mixes the vaporized first and second liquid precursors with an oxidizing gas such as oxygen, $N_2O$, $O_3$ or combinations thereof, at a temperature above the vaporization temperature of the precursors and below a temperature which degrades the components. The process is very sensitive to changes in temperature of the substrate, solvent content of the liquid precursors, and concentration of the oxidizer in the combined gases. Increasing the wafer temperature increases the deposition rate, reducing the solvent content of the liquid precursors reduces the haze of the films, and controlling the oxidizer flow rate controls the roughness of the film and crystalline phase.

While the foregoing is directed to one embodiment of the invention, other and further embodiments of the invention may be devised without departing from the basic scope thereof, and the scope thereof is determined by the claims which follow.

What is claimed is:

1. A gas feedthrough for a processing chamber, comprising:
    a chamber body;
    a conduit defined in the chamber body, having an inlet and an outlet, the conduit defining a surface for forming a seal with the chamber body; and
    a tubular filter disposed in the conduit, said filter having a pore size and a surface area sufficient to prevent an excessive pressure differential to form across said filter.

2. The gas feedthrough of claim 1, wherein said filter is capable of filtering particulate matter having a size of about 0.2 microns.

3. The gas feedthrough of claim 1, wherein said filter has a pore size of about 5–80 microns.

4. The gas feedthrough of claim 1, wherein said filter has a pore size of about 5–50 microns.

5. The gas feedthrough of claim 1, wherein said filter has a pore size of about 5–20 microns.

6. The gas feedthrough of claim 1, wherein said filter has a pore size of about 5–15 microns.

7. The gas feedthrough of claim 1, further comprising a heating member disposed along the length of the conduit.

8. The gas feedthrough of claim 7, wherein said heating member is capable of maintaining a feedthrough temperature of about 150–300° C.

9. The gas feedthrough of claim 7, further comprising a thermocouple disposed adjacent the heating member.

10. The gas feedthrough of claim 1, wherein said filter is disposed longitudinally along a length of said conduit.

11. The gas feedthrough of claim 1, wherein said filter comprises one or more grooves on an inner surface of said filter.

12. The gas feedthrough of claim 1, wherein said pressure differential is between about 0–20 Torr.

13. A process chamber for depositing a film, said chamber comprising:
    a chamber body forming an enclosure having one or more temperature controlled surfaces;
    a lid movably mounted on the chamber body and enclosing a process volume within the chamber body, said lid having a heated main body and an outer temperature-controlled collar;
    a cavity formed in the chamber body;
    a passage formed through the lid and coupling the cavity and the process volume;
    a substrate support disposed in the process volume;
    an annular gas feedthrough disposed in the cavity; and
    a filter disposed in the gas feedthrough.

14. The process chamber of claim 13, wherein said surface area of said filter is of sufficient size to allow processing of at least about 1000 substrates without the excessive pressure differential forming across said filter.

15. The process chamber of claim 13, wherein said gas source comprises a vaporizer.

16. The process chamber of claim 15, wherein said vaporizer comprises one or more filters disposed therein.

17. The process chamber of claim 16, further comprising a vacuum pump disposed downstream of said vaporizer.

18. The process chamber of claim 13, wherein said filter comprises sintered stainless steel, titanium, nickel, aluminum, aluminum oxide, barium strontium titanate, aluminum nitride, silicon carbide, or combinations thereof.

19. A process chamber for depositing a film, comprising:
    a chamber body having one or more temperature controlled surfaces;
    a lid movably mounted on the chamber body, said lid having a heated main body and a temperature controlled collar;
    a gas feedthrough fluidicly coupled to said chamber and to a gas source, said feedthrough having a heating member; and
    a tubular filter disposed in the gas feedthrough.

20. The process chamber of claim 19, wherein said filter is disposed longitudinally along the length of said gas feedthrough.

21. The process chamber of claim 19, wherein said filter has a porosity of about 5 $\mu$m to about 100 $\mu$m.

22. The process chamber of claim 19, further comprising a vaporizer fluidicly coupled upstream to said gas feedthrough.

23. The process chamber of claim 22, further comprising a vacuum pump disposed downstream of said vaporizer.

24. The process chamber of claim 13, wherein the filter is tubular.

25. The process chamber of claim 13, wherein the cavity volume is disposed laterally relative to the process volume.

26. The process chamber of claim 13, wherein the filter has a pore size and a surface area sufficient to prevent an excessive pressure differential from forming across said filter.

27. A gas feedthrough for a processing chamber, comprising:
    a conduit having an inlet and an outlet, the conduit defining a surface for forming seal with the chamber;
    a tubular filter disposed in the conduit; and
    a heating member disposed along the length of said conduit.

28. The gas feedthrough of claim 27, wherein said filter has a porosity of about 5 $\mu$m to about 100 $\mu$m.

* * * * *